(12) United States Patent
Tel et al.

(10) Patent No.: US 12,315,175 B2
(45) Date of Patent: May 27, 2025

(54) METHOD IN THE MANUFACTURING PROCESS OF A DEVICE, A NON-TRANSITORY COMPUTER-READABLE MEDIUM AND A SYSTEM CONFIGURED TO PERFORM THE METHOD

(71) Applicant: ASML NETHERLANDS B.V., Veldhoven (NL)

(72) Inventors: Wim Tjibbo Tel, Helmond (NL); Antoine Gaston Marie Kiers, Veldhoven (NL); Vadim Yourievich Timoshkov, Veldhoven (NL); Hermanus Adrianus Dillen, Maarheeze (NL); Yichen Zhang, Eindhoven (NL); Te-Sheng Wang, San Jose, CA (US); Tzu-Chao Chen, Dublin, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 1001 days.

(21) Appl. No.: 17/289,874

(22) PCT Filed: Sep. 23, 2019

(86) PCT No.: PCT/EP2019/075531
§ 371 (c)(1),
(2) Date: Apr. 29, 2021

(87) PCT Pub. No.: WO2020/094286
PCT Pub. Date: May 14, 2020

(65) Prior Publication Data
US 2021/0407112 A1    Dec. 30, 2021

Related U.S. Application Data

(60) Provisional application No. 62/851,727, filed on May 23, 2019.

(30) Foreign Application Priority Data

Nov. 9, 2018    (EP) .................................. 18205329

(51) Int. Cl.
*G06T 7/33* (2017.01)
*G06T 7/00* (2017.01)

(52) U.S. Cl.
CPC .............. *G06T 7/33* (2017.01); *G06T 7/0008* (2013.01); *G06T 2207/10061* (2013.01); *G06T 2207/30148* (2013.01)

(58) Field of Classification Search
CPC ..................... G06T 7/33; G06T 7/0008; G06T 2207/10061; G06T 2207/30148; G03F 7/70633; G03F 7/705
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |

(Continued)

FOREIGN PATENT DOCUMENTS

| | | |
|---|---|---|
| CN | 1795536 | 6/2006 |
| CN | 107797389 | 3/2018 |

(Continued)

OTHER PUBLICATIONS

Shinichi Shinoda ("Focus measurement using SEM image analysis of circuit pattern") (Year: 2016).*

(Continued)

*Primary Examiner* — Solomon G Bezuayehu
(74) *Attorney, Agent, or Firm* — Pillsbury Winthrop Shaw Pittman, LLP

(57) ABSTRACT

A method for determining an image-metric of features on a substrate, the method including: obtaining a first image of a plurality of features on a substrate; obtaining one or more (Continued)

further images of a corresponding plurality of features on the substrate, wherein at least one of the one or more further images is of a different layer of the substrate than the first image; generating aligned versions of the first and one or more further images by performing an alignment process on the first and one or more further images; and calculating an image-metric in dependence on a comparison of the features in the aligned version of the first image and the corresponding features in the one or more aligned versions of the one or more further images.

20 Claims, 32 Drawing Sheets

(56) References Cited

U.S. PATENT DOCUMENTS

| | | | |
|---|---|---|---|
| 5,523,193 | A | 6/1996 | Nelson |
| 5,879,866 | A * | 3/1999 | Starikov ............... G03F 7/0035 430/324 |
| 5,969,441 | A | 10/1999 | Loopstra et al. |
| 6,046,792 | A | 4/2000 | Van Der Werf et al. |
| 7,587,704 | B2 | 9/2009 | Ye et al. |
| 11,230,471 | B2 * | 1/2022 | Cok ........................ B81C 3/001 |
| 2003/0006371 | A1 * | 1/2003 | Watanabe ............... H01J 37/28 250/307 |
| 2004/0233521 | A1 * | 11/2004 | McWilliams .......... G02B 23/16 359/399 |
| 2005/0076322 | A1 | 4/2005 | Ye et al. |
| 2006/0017936 | A1 * | 1/2006 | Cantin ............... G01B 11/0608 356/604 |
| 2009/0063378 | A1 * | 3/2009 | Izikson ............... G03F 7/70633 706/21 |
| 2009/0157360 | A1 | 6/2009 | Ye et al. |
| 2010/0315614 | A1 | 12/2010 | Hansen |
| 2011/0147586 | A1 * | 6/2011 | Fukuda ................... H01J 37/28 250/310 |
| 2011/0226968 | A1 * | 9/2011 | Platzgummer ...... H01J 37/3177 250/492.3 |
| 2011/0230999 | A1 | 9/2011 | Chen et al. |
| 2012/0013881 | A1 * | 1/2012 | Den Boef ........... G03F 7/70633 356/337 |
| 2013/0084655 | A1 * | 4/2013 | Yue .................... G03F 7/70466 257/E21.527 |
| 2013/0179847 | A1 | 7/2013 | Hansen |
| 2014/0267671 | A1 | 9/2014 | Kenny et al. |
| 2015/0058814 | A1 * | 2/2015 | Cai .......................... G03F 1/36 716/53 |
| 2015/0258736 | A1 * | 9/2015 | Chen .................... B29C 64/393 700/98 |
| 2016/0033451 | A1 * | 2/2016 | Suehle ............. G01N 33/48721 427/244 |
| 2016/0209275 | A1 * | 7/2016 | Cheung ................. H01Q 1/526 |

FOREIGN PATENT DOCUMENTS

| | | |
|---|---|---|
| EP | 3462240 | 4/2019 |
| KR | 10-2015-0131047 | 11/2015 |
| TW | 201140255 | 11/2011 |
| TW | 201510518 | 3/2015 |

OTHER PUBLICATIONS

International Search Report and Written Opinion issued in corresponding PCT Patent Application No. PCT/EP2019/075531, dated Jan. 21, 2020.
Extended European Search Report issued in corresponding European Patent Application No. 18205329.8, dated May 21, 2019.
Taiwanese Office Action issued in corresponding Taiwanese Patent Application No. 108136345, dated Oct. 6, 2022.
Nnishinoda, S. et al.: "Focus measurement using SEM image analysis of circuit pattern", Proc. of SPIE, vol. 9778 (2016).
Mulkens, J. et al.: "Holistic approach for overlay and edge placement error to meet the 5nm technology node requirements", Proc. of SPIE, vol. 10585 (Mar. 13, 2018).
Ppfspence, C.: "Full-Chip Lithography Simulation and Design Analysis—How OPC is Changing IC Design", Proc. of SPIE, vol. 5751, pp. 1-14 (2005).
Cao, Y. et al.: "Optimized Hardware and Software for Fast, Full Chip Simulation", Proc. of SPIE, vol. 5754 (2005).
Socha, R. et al.: "Simultaneous Source Mask Optimization (SMO)", Proc. of SPIE, vol. 5853 (2005).
Office Action issued in corresponding Korean Patent Application No. 10-2021-7013872, dated Apr. 17, 2023.
S. Shinoda et al., "Focus measurement using SEM image analysis of circuit pattern", Proc. of SPIE, vol. 9778, pp. 1-7 (2016).
Office Action issued in corresponding Taiwanese Patent Application No. 108136345, dated May 16, 2023.
A. Charley et al., "Advanced CD-SEM solution for edge placement error characterization of BEOL pitch 32nm metal layers", Proc. SPIE, vol. 10585 (Mar. 2018).
Y. Takemasa et al., "Advanced CD-SEM imaging methodology for EPE measurements", Proc. SPIE, vol. 10585 (Mar. 2018).
K. Hitomi et al., "Improvement of optical proximityeffect correction model accuracy by hybrid optical proximity-effect correction modeling and shrink correction technique for 10-nm node process", Journal of Micro/Nanolithography, MEMS, and MOEMS, vol. 15, No. 3, pp. 1-9 (2016).
A. Miyamoto et al., "Generation of large field SEM image by panorama composition technology for nano-order measurement", Measurement Science and Technology, vol. 27, No. 2 (2016).
Office Action issued in corresponding Chinese Patent Application No. 201980073797.9, dated Oct. 11, 2024.

* cited by examiner

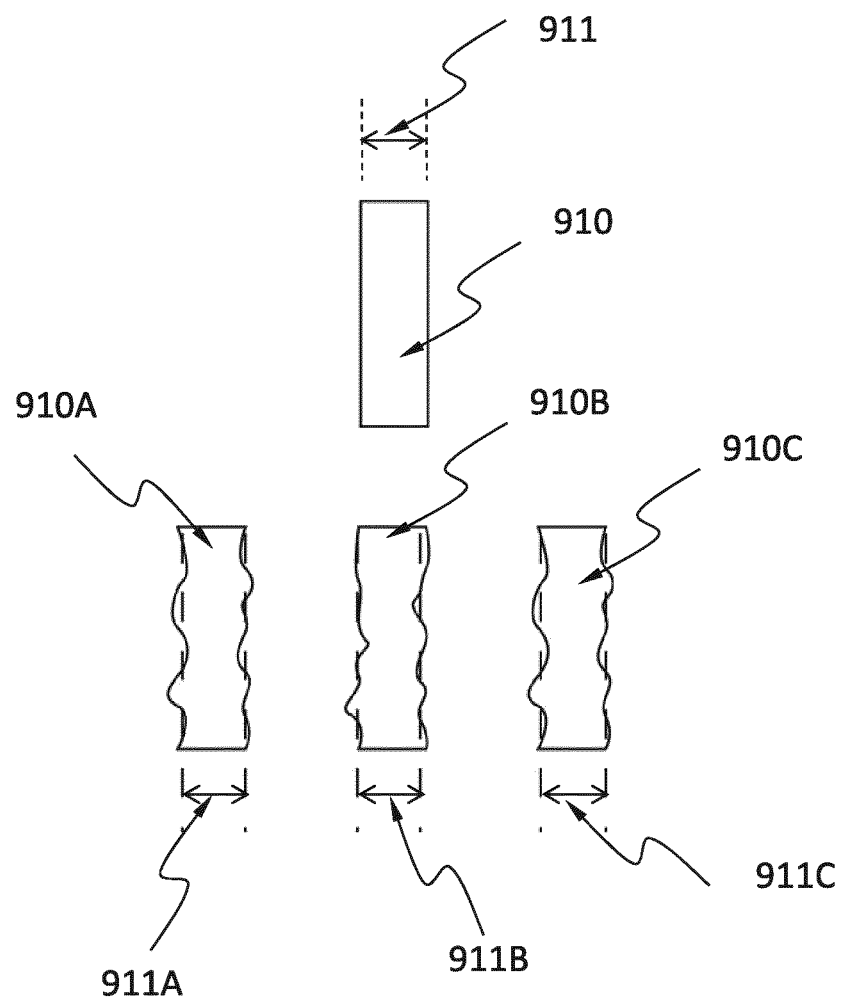

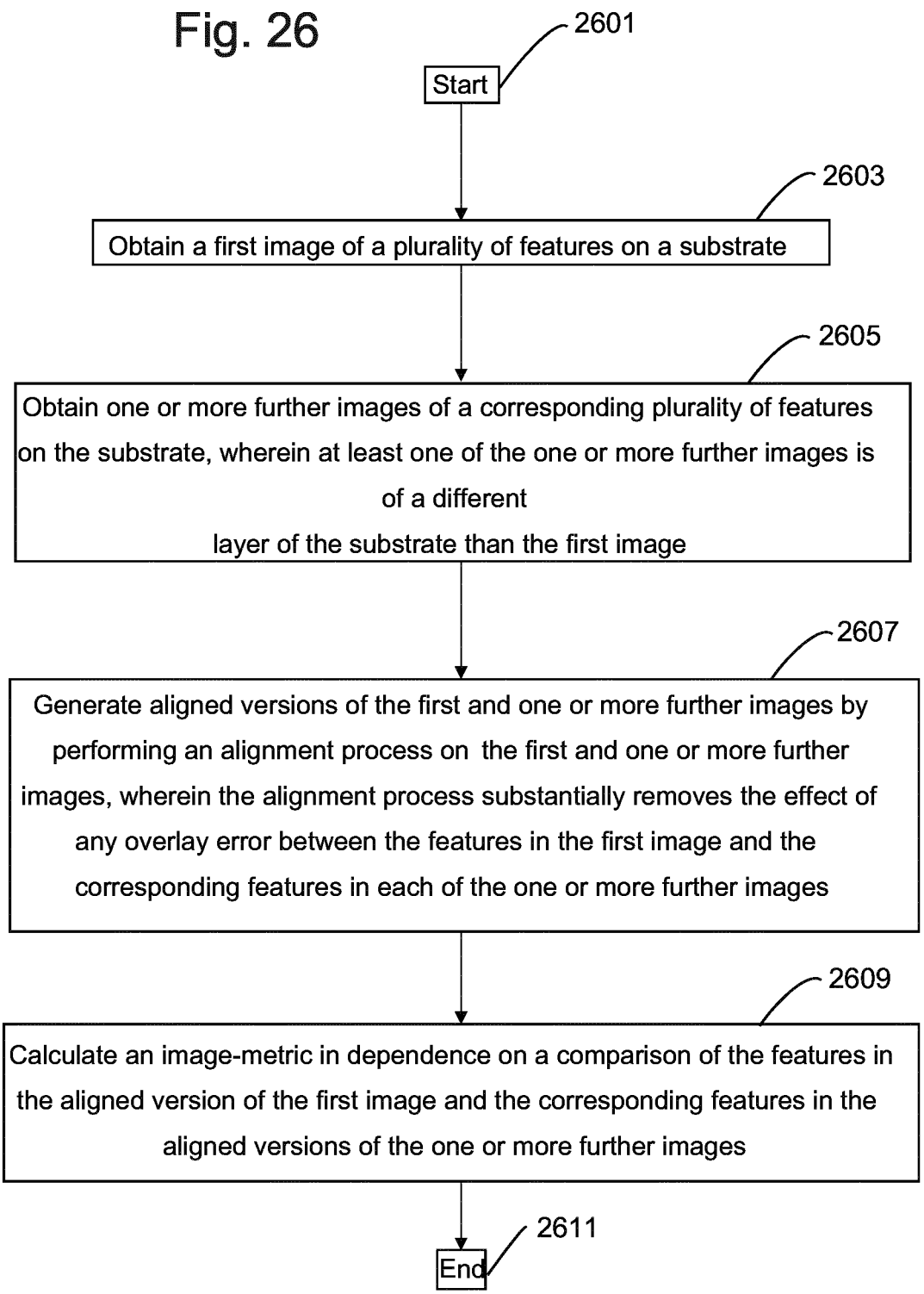

METHOD IN THE MANUFACTURING PROCESS OF A DEVICE, A NON-TRANSITORY COMPUTER-READABLE MEDIUM AND A SYSTEM CONFIGURED TO PERFORM THE METHOD

CROSS-REFERENCE RELATED TO APPLICATIONS

This application is the U.S. national phase entry of PCT Patent Application No. PCT/EP2019/075531 which was filed on Sep. 23, 2019, which claims the benefit of priority of European Patent Application No. 18205329.8 which was filed on Nov. 9, 2018 and U.S. Provisional Patent Application No. 62/851,727 which was filed on May 23, 2019, each of which is incorporated herein in its entirety by reference.

TECHNICAL FIELD

The description herein relates to the manufacture, testing, measurement and other processes that may be performed on semiconductor structures that are manufactured on a substrate and, more particularly, a method, non-transitory computer-readable medium and system for improving any of the processes in dependence on images of features of the structures

BACKGROUND

A lithographic projection apparatus can be used, for example, in the manufacture of integrated circuits (ICs). In such a case, a patterning device (e.g., a mask) may contain or provide a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic projection apparatus, one target portion at a time. In one type of lithographic projection apparatuses, the circuit pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithographic projection apparatus will have a magnification factor M (generally <1), the speed F at which the substrate is moved will be a factor M times that at which the projection beam scans the patterning device. More information with regard to lithographic devices as described herein can be gleaned, for example, from U.S. Pat. No. 6,046,792, incorporated herein by reference.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, lithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, accurate determination of control parameters of all processes in the manufacture of a device are required.

BRIEF SUMMARY

According to a first aspect of the invention, there is provided a method for determining an image-metric of features on a substrate, the method comprising: obtaining a first image of a plurality of features on a substrate; obtaining one or more further images of a corresponding plurality of features on the substrate, wherein at least one of the one or more further images is of a different layer of the substrate than the first image; generating aligned versions of the first and one or more further images by performing an alignment process on the first and one or more further images, wherein the alignment process substantially removes the effect of any overlay error between the features in the first image and the corresponding features in each of the one or more further images; and calculating an image-metric in dependence on a comparison of the features in the aligned version of the first image and the corresponding features in the aligned versions of the one or more further images.

Preferably, each of the plurality of features is created in dependence on a target structure of the feature; and the alignment process of the images comprises substantially aligning the images in dependence on the target structures of the features.

Preferably, the alignment process of the images comprises substantially aligning the images in dependence on one or more reference positions in, or superimposed onto, each of the images.

Preferably, each image is of a different layer of the substrate than the other images.

Preferably, there are a plurality of further images and at least one of the further images is of the same layer of the substrate as the first image.

Preferably, each image is an image of only part of the substrate.

Preferably, the method further comprises: obtaining, for each of a plurality of layers of a substrate, a plurality of images of a plurality of different parts of the layer of the substrate; and calculating the image-metric in dependence on images of each of the plurality of different parts of the substrate in a plurality of layers of the substrate.

Preferably, the method comprises calculating a local image-metric in dependence on a plurality of images of the same part of the substrate; wherein the image-metric comprises the local image-metric.

Preferably, the method comprises calculating a plurality of local image-metrics; wherein each of the local image-metrics is calculated in dependence on images of a different part of the substrate than the other local image-metrics; and wherein the image-metric comprises the plurality of local image-metrics.

Preferably, the method comprises calculating a global image-metric in dependence on the plurality of local image-metrics; wherein the image-metric comprises the global image-metric.

Preferably, each image of part of the substrate is a 10 μm by 10 μm area on the substrate.

Preferably, the image-metric is determined in dependence on the contours of the features in the aligned version of the first image and the contours of the corresponding features in the aligned versions of the one or more further images; and/or the image-metric is determined in dependence on, for one or more of the images, a comparison of the feature in the image with the target of the feature.

Preferably, the image-metric is determined in dependence on one or more of: critical dimension uniformity, line width roughness, critical dimension amplitude and placement errors of the features in the aligned version of the first image and the corresponding features in the aligned versions of the one or more further images.

Preferably, the method further comprises: calculating the image-metric for each of a plurality of values of one or more parameters; and determining the dependence of the image-metric on the one or more parameters in dependence on the calculated image-metrics.

Preferably, the one or more parameters include focus, dose, illumination pupil shape, aberrations, etch rate, overlay, contrast, critical dimension, chuck temperature, gas flows and RF power distribution.

Preferably, the image-related metric is an overlay margin, an overlapping overlay margin, an overlay margin map or an overlapping overlay margin map.

According to a second aspect of the invention, there is provided a method in the manufacturing, inspection and/or testing processes of a device on a substrate, the method comprising: obtaining an image-metric according to the first aspect; and determining one or more control parameters of manufacturing, inspection and/or testing processes of a device on a substrate in dependence on the image-metric.

Preferably, the one or more control parameters are determined in dependence on the dependence of the image-metrics on the one or more control parameters.

Preferably, the method further comprises controlling an apparatus in dependence on the determined one or more control parameters.

Preferably, the one or more control parameters are for one or more of: a lithographic process, a priming process, a resist coating process, a soft baking process, a post-exposure baking process, a development process, a hard baking process, measurement/inspection processes, an etching process, an ion-implantation process, a metallization process, an oxidation process and a chemo-mechanical polishing process.

Preferably, the one or more control parameters include focus, dose, illumination pupil shape, aberrations, etch rate, overlay, contrast, critical dimension, chuck temperature, gas flows and RF power distribution.

Preferably, the method further comprises further determining the one or more control parameters in dependence on a manufacturing specification; wherein the manufacturing specification is dependent on one or more of: a maximum probability of the features being incorrectly manufactured; a determined maximum allowable magnitude of an edge placement error; a determined maximum allowable overlay error; and a desired yield of semiconductor devices.

Preferably, a plurality of control parameters are co-determined.

Preferably, the co-determination of at least two of the control parameters comprises determining an applied value of one of the control parameters in dependence on an applied value of another of the control parameters.

Preferably, the co-determination of at least two of the control parameters is dependent on: the combined effect of the at least two control parameters; and/or the interdependence of the at the least two control parameters.

Preferably: the overlay error is dependent on at least one of the co-determined control parameters; and the dimensions of features manufactured on a semiconductor device are dependent on at least one other one of the co-determined control parameters.

Preferably, the co-determined control parameters are focus, dose, illumination pupil shape, aberrations, etch rate, overlay, contrast, critical dimension, chuck temperature, gas flows and RF power distribution.

According to a third aspect of the invention, there is provided a system configured to perform the method of the first and/or second aspect.

Preferably, the system comprises a computing system and an electron beam apparatus, wherein: the electron beam apparatus is arranged to obtain images of a substrate; and the computing system is arranged to receive the obtained images of a substrate and perform the method of the first and/or second aspect.

Preferably, the system comprises a lithographic apparatus and/or a metrology apparatus.

According to a fourth aspect of the invention, there is provided a non-transitory computer-readable medium comprising instructions that, when executed, cause the manufacturing process of a device on a substrate to be controlled according to the method of any of the first and/or second aspect.

BRIEF DESCRIPTION OF THE DRAWINGS

FIG. 3B schematically depicts LWR.

FIG. 26 is a flowchart of a method according to an embodiment.

DETAILED DESCRIPTION

Figure 1:
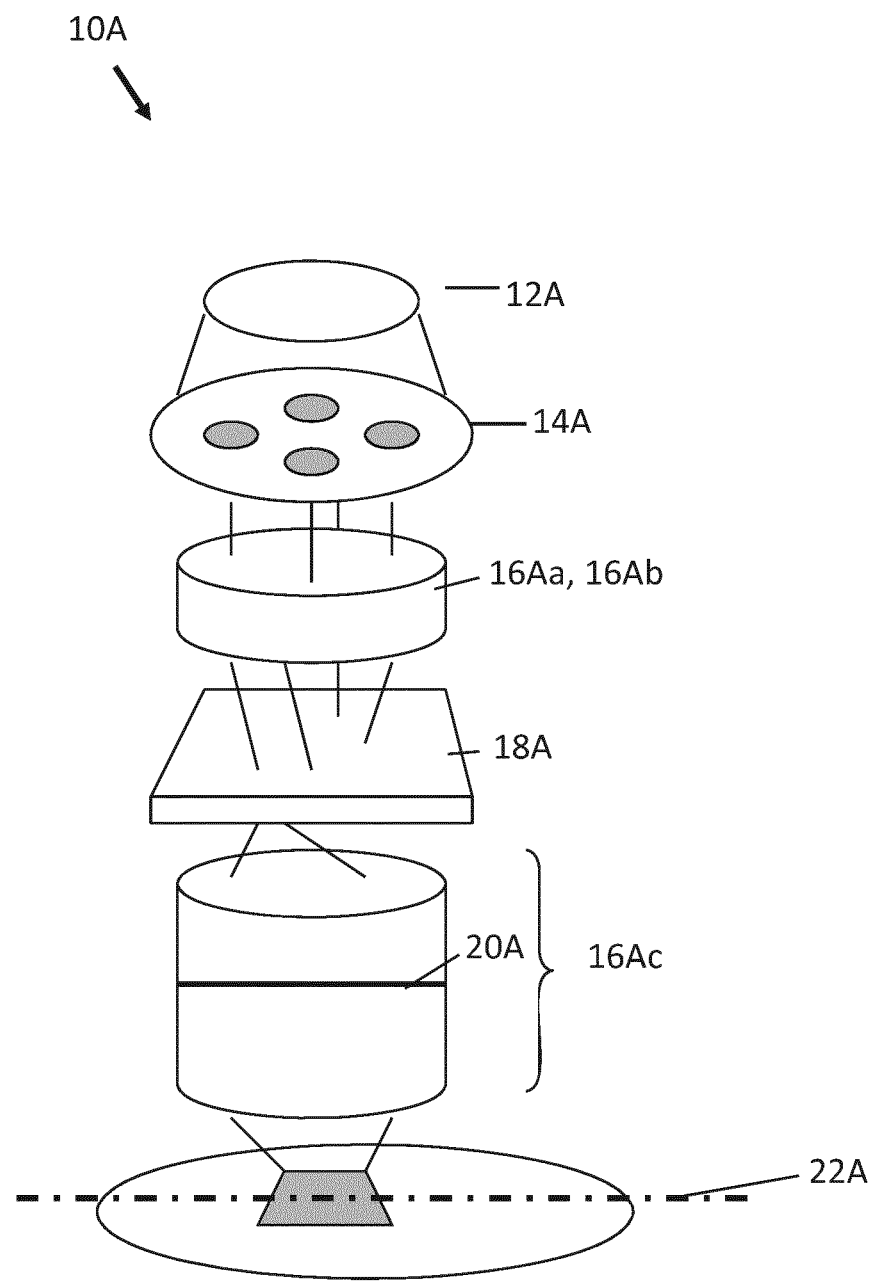
FIG. 1 is a block diagram of various subsystems of a lithography system.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein refers to or means adjusting a lithographic projection apparatus, a lithographic process, etc. such that results and/or processes of lithography have more desirable characteristics, such as higher accuracy of projection of a design layout on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

Further, the lithographic projection apparatus may be of a type having two or more tables (e.g., two or more substrate table, a substrate table and a measurement table, two or more patterning device tables, etc.). In such "multiple stage" devices a plurality of the multiple tables may be used in parallel, or preparatory steps may be carried out on one or more tables while one or more other tables are being used for exposures. Twin stage lithographic projection apparatuses are described, for example, in U.S. Pat. No. 5,969,441, incorporated herein by reference.

The patterning device referred to above comprises, or can form, one or more design layouts. The design layout can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. One or more of the design rule limitations may be referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

- a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.
- a programmable LCD array. An example of such a construction is given in U.S. Pat. No. 5,229,872, which is incorporated herein by reference.

As a brief introduction, FIG. 1 illustrates an exemplary lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which define the partial coherence (denoted as sigma) and which may include optics 14A, 16Aa and 16Ab that shape radiation from the source 12A; a patterning device 14A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=n sin ($\Theta_{max}$), n is the Index of Refraction of the media between the last element of project optics and the substrate.

In an optimization process of a system, a figure of merit of the system can be represented as a cost function. The optimization process boils down to a process of finding a set of parameters (design variables) of the system that optimizes (e.g., minimizes or maximizes) the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations (i.e., worst deviation). The term "evaluation points" herein should be interpreted broadly to include any characteristics of the system. The design variables of the system can be confined to finite ranges and/or be interdependent due to practicalities of implementations of the system. In the case of a lithographic projection apparatus, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

In a lithographic projection apparatus, a source provides illumination (i.e. radiation) to a patterning device and projection optics direct and shape the illumination, via the patterning device, onto a substrate. The term "projection optics" is broadly defined here to include any optical component that may alter the wavefront of the radiation beam. For example, projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in U.S. Patent Application Publication No. US 2009-0157360, the disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the source and the projection optics.

Figure 2:
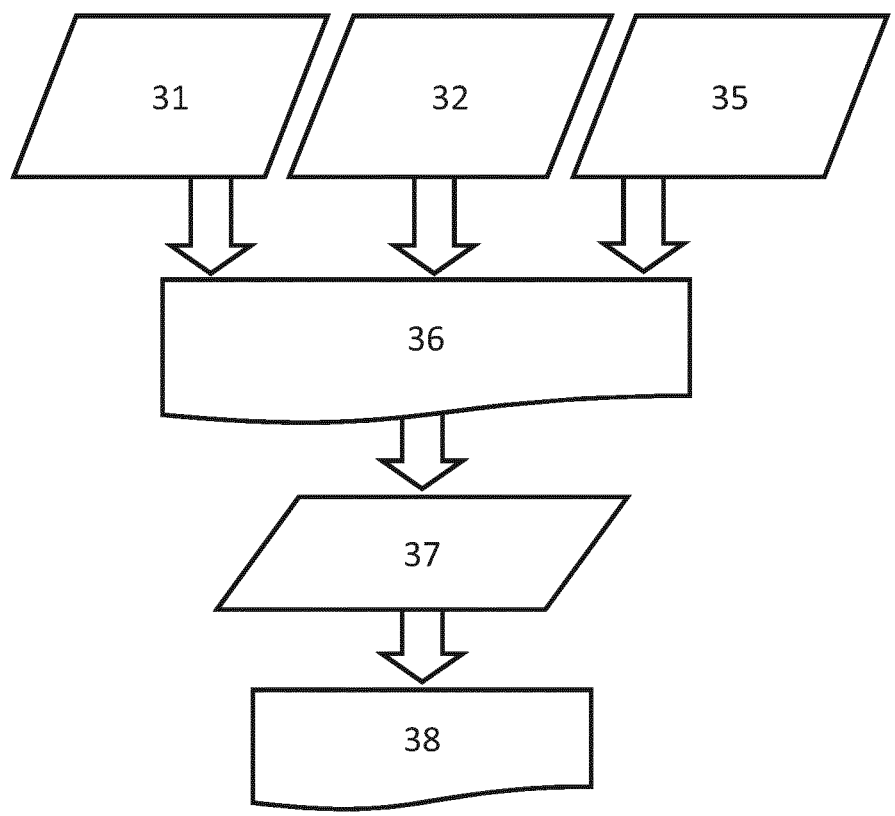
FIG. 2 is a block diagram of simulation models corresponding to the subsystems in FIG. 1.

An exemplary flow chart for simulating lithography in a lithographic projection apparatus is illustrated in FIG. 2. A source model 31 represents optical characteristics (including radiation intensity distribution and/or phase distribution) of the source. A projection optics model 32 represents optical characteristics (including changes to the radiation intensity distribution and/or the phase distribution caused by the projection optics) of the projection optics. A design layout model 35 represents optical characteristics (including changes to the radiation intensity distribution and/or the phase distribution caused by a given design layout 33) of a design layout, which is the representation of an arrangement of features on or formed by a patterning device. An aerial image 36 can be simulated from the design layout model 35, the projection optics model 32 and the design layout model 35. A resist image 38 can be simulated from the aerial image 36 using a resist model 37. Simulation of lithography can, for example, predict contours and CDs in the resist image.

More specifically, it is noted that the source model 31 can represent the optical characteristics of the source that include, but not limited to, NA settings, sigma ($\sigma$) settings as well as any particular illumination shape (e.g. off-axis radiation sources such as annular, quadrupole, dipole, etc.). The projection optics model 32 can represent the optical characteristics of the projection optics, including aberration, distortion, one or more refractive indexes, one or more physical sizes, one or more physical dimensions, etc. The design layout model 35 can represent one or more physical properties of a physical patterning device, as described, for example, in U.S. Pat. No. 7,587,704, which is incorporated by reference in its entirety. The objective of the simulation is to accurately predict, for example, edge placement, aerial image intensity slope and/or CD, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In an example, a set of clips is extracted, which represents the complicated patterns in the design layout (typically about 50 to 1000 clips, although any number of clips may be used). These patterns or clips represent small portions (i.e. circuits, cells or patterns) of the design and more specifically, the clips typically represent small portions for which particular attention and/or verification is needed. In other words, clips may be the portions of the design layout, or may be similar or have a similar behavior of portions of the design layout, where one or more critical features are identified either by experience (including clips provided by a customer), by trial and error, or by running a full-chip simulation. Clips may contain one or more test patterns or gauge patterns.

An initial larger set of clips may be provided a priori by a customer based on one or more known critical feature areas in a design layout which require particular image optimization. Alternatively, in another example, an initial larger set of clips may be extracted from the entire design layout by using some kind of automated (such as machine vision) or manual algorithm that identifies the one or more critical feature areas.

In a lithographic projection apparatus, for example, using an EUV (extreme ultra-violet radiation, e.g. having a wavelength in the range 5-20 nm) source or a non-EUV source, reduced radiation intensity may lead to stronger stochastic variation, such as pronounced line width roughness and/or local CD variation in small two-dimensional features such as holes. In a lithographic projection apparatus using an EUV source, reduced radiation intensity may be attributed to low total radiation output from the source, radiation loss from optics that shape the radiation from the source, transmission loss through the projection optics, high photon energy that leads to fewer photons under a constant dose, etc. The stochastic variation may be attributed to factors such as photon shot noise, photon-generated secondary electrons, photon absorption variation, and/or photon-generated acids in the resist. The small size of features further compounds this stochastic variation. The stochastic variation in smaller features is a significant factor in production yield and justifies inclusion in a variety of optimization processes of the lithographic process and/or lithographic projection apparatus.

Under a same radiation intensity, lower exposure time of each substrate leads to higher throughput of a lithographic projection apparatus but stronger stochastic variation. The photon shot noise in a given feature under a given radiation intensity is proportional to the square root of the exposure time. The desire to lower exposure time for the purpose of increasing throughput exists in lithography using EUV and other radiation sources. Therefore, the methods and apparatuses described herein that consider the stochastic variation in the optimization process are not limited to EUV lithography.

The throughput can also be affected by the total amount of radiation directed to the substrate. In some lithographic projection apparatuses, a portion of the radiation from the source is sacrificed in order to achieve a desired shape of the illumination.

Figure 3A:
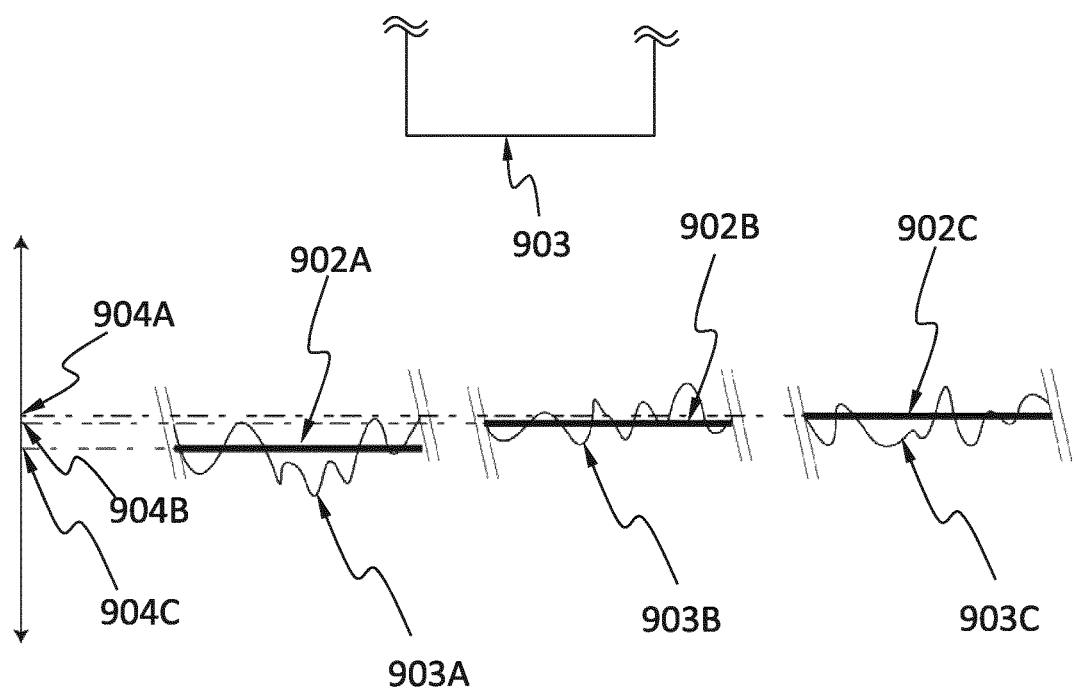
FIG. 3A schematically depicts LER.

FIG. 3A schematically depicts line edge roughness (LER). Assuming all conditions are identical in three exposures or simulations of exposure of an edge 903 of a feature on a design layout, the resist images 903A, 903B and 903C of the edge 903 may have slightly different shapes and locations. Locations 904A, 904B and 904C of the resist images 903A, 903B and 903C may be measured by averaging the resist images 903A, 903B and 903C, respectively. A stochastic variation such as line edge roughness is usually represented by a parameter of the distribution of the underlying characteristic. In this example, LER of the edge 903 may be represented by 3σ of the spatial distribution of the edge 903, assuming the distribution is a normal distribution. The 3σ may be derived from the locations of the edge 903 (e.g., the locations 904A, 904B and 904C) in many exposures or simulations of the edge 903. LER represents the range in which the edge 903 probably will fall due to the stochastic effect. For this reason, the LER can also be called stochastic edge placement error (SEPE). LER may be greater than the changes of the edge 903 position caused by non-stochastic effects.

FIG. 3B schematically depicts line width roughness (LWR). Assuming all conditions are identical in three exposures or simulations of exposure of a long rectangle feature 910 with a width 911 on a design layout, the resist images 910A, 910B and 910C of the rectangle feature 910 may have slightly different widths 911A, 911B and 911C, respectively. LWR of the rectangle feature 910 may be a measure of the distribution of the widths 911A, 911B and 911C. For example, the LWR may be a 3σ of the distribution of the width 911, assuming the distribution is a normal distribution. The LWR may be derived from many exposures or simulations of the width 911 of the rectangle feature 910 (e.g., the widths 911A, 911B and 911C). In the context of a short feature (e.g., a contact hole), the widths of its images are not well defined because long edges are not available for averaging their locations. A similar quantity, LCDU, may be used to characterize the stochastic variation. The LCDU is a 3σ of the distribution (assuming the distribution is a normal distribution) of measured CDs of images of the short feature.

Figure 3C:
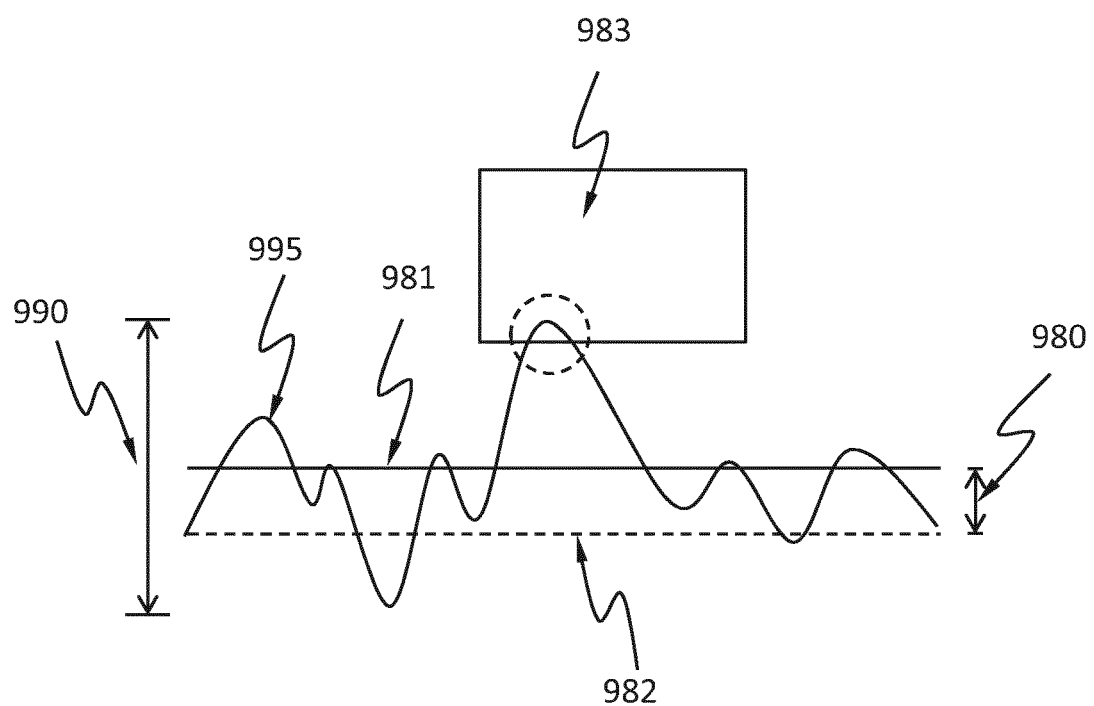
FIG. 3C schematically illustrates how a stochastic variation may affect lithography.

FIG. 3C schematically illustrates how a stochastic variation may affect lithography. In the example in FIG. 3C, an intended position of an edge of a feature in an aerial image or resist image is indicated as the dotted line 982. The actual edge is indicated as the curve 995, which comprises both a stochastic variation (LER in this example) and an error (e.g., caused by other factors such as dose variation, focus variation, source shape, patterning device (e.g., mask) error, etc.) unrelated to stochastic effect. The average location of the actual edge is indicated as the solid line 981. The difference 980 between the average location (the solid line 981) and the intended location (the dotted line 982) is the error unrelated to stochastic effect, which may be referred to as an edge placement error (EPE). The variation of the actual edge relative to the average location is the stochastic variation. The band 990 around the average location (the solid line 981) that encloses the stochastic variation may be called a stochastic variation band, which represents the extent the actual local edge placement may reach due to a stochastic effect. The width of the stochastic variation band may be greater than the EPE. Therefore, the total probabilistic deviation from the intended location (the dotted line 982) of the edge may be a sum of the EPE and the stochastic variation band. If there were no stochastic variation, the actual location of the edge in this example would be at the location indicated by the solid line 981, which does not merge with a neighboring feature 983 and thus does not produce a defect. However, when a stochastic variation is present and the stochastic variation band is large enough (e.g., the band 990), the actual edge may merge (where marked by the dotted circle) with the neighboring feature 983 and thus produce a defect. Therefore, it is desirable to evaluate, simulate or reduce a stochastic variation.

Figure 4A:
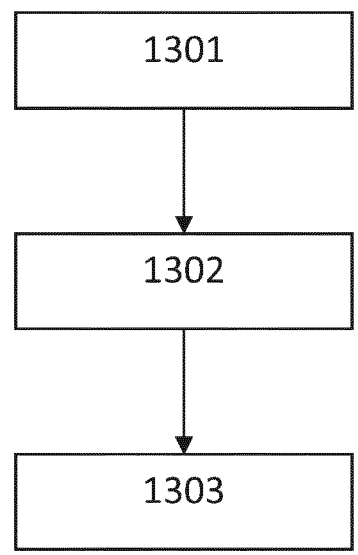
FIG. 4A and FIG. 4B schematically show a method of determining a relationship between a stochastic variation of a characteristic of an aerial image or a resist image and one or more design variables.
Figure 4B:
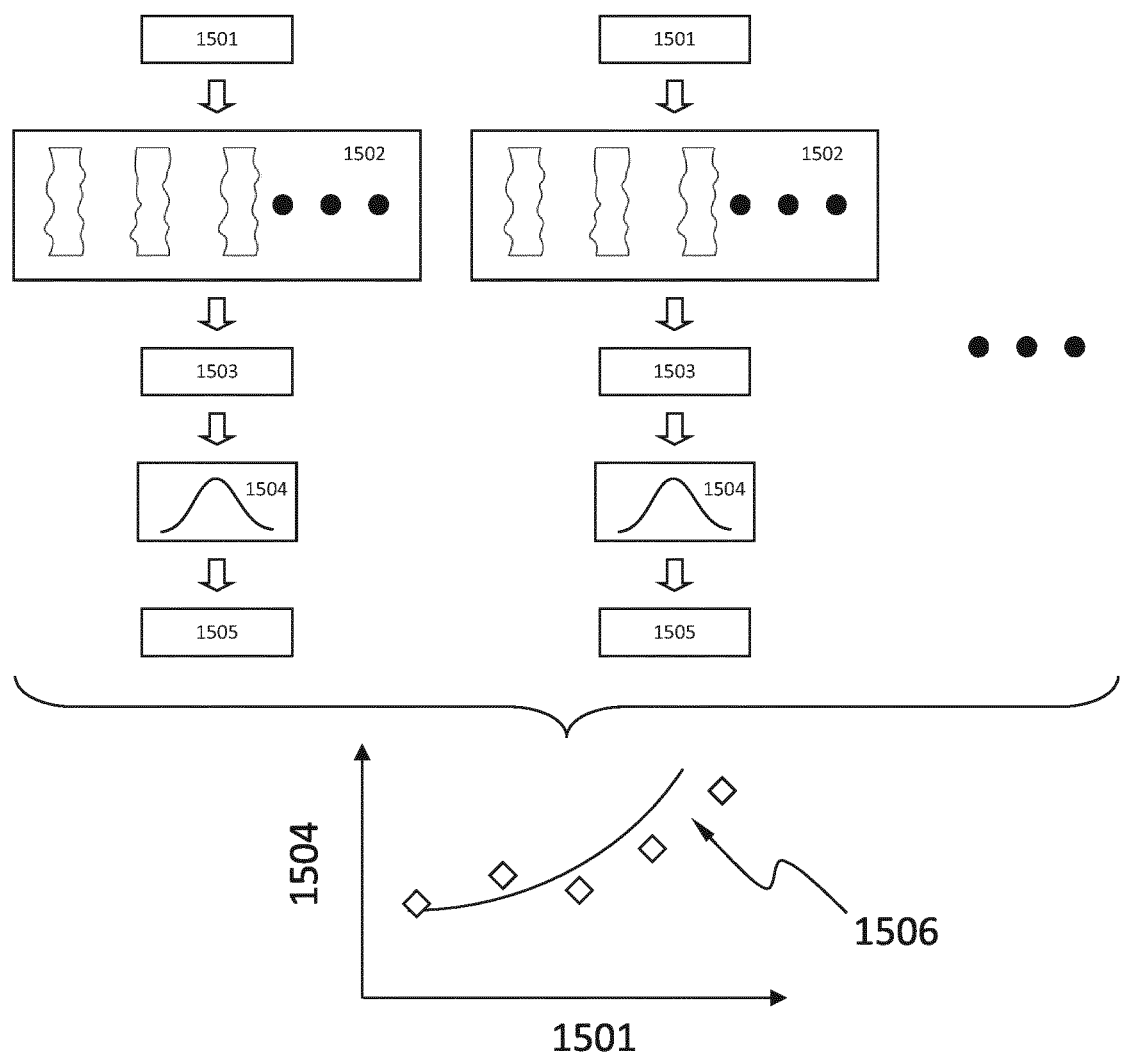

A method of determining a relationship between a stochastic variation of a characteristic of an aerial image or a resist image and one or more design variables is depicted in a flow chart in FIG. 4A and a schematic in FIG. 4B. In step 1301, values 1503 of the characteristic are measured from a plurality of aerial images or resist images 1502 formed (by actual exposure or simulation) for each of a plurality of sets 1501 of values of the one or more design variables. In step 1302, a value 1505 of the stochastic variation is determined for each set 1501 of values of the one or more design variables from a distribution 1504 of the values 1503 of the characteristic measured from the aerial images or resist images formed for that set 1501 of values of the one or more design variables. In step 1303, a relationship 1506 is determined by fitting one or more parameters of a model from the values 1504 of the stochastic variation and the sets 1501 of values of the one or more design variables.

In an example, the stochastic variation is the LER and the one or more design variables are blurred image ILS (bl_ILS), dose and image intensity. The model may be:

$$LER = a \times bl\_ILS^b \times (dose \times image\ intensity)^c \quad (Eq.\ 30)$$

The parameters a, b and c may be determined by fitting. The blurred image ILS (bl_ILS) is the image log slope ILS with a spatial blur applied thereto. The spatial blur may represent blur of a resist image due to diffusion of a chemical species generated in a resist layer by exposure to radiation.

Figure 5A:
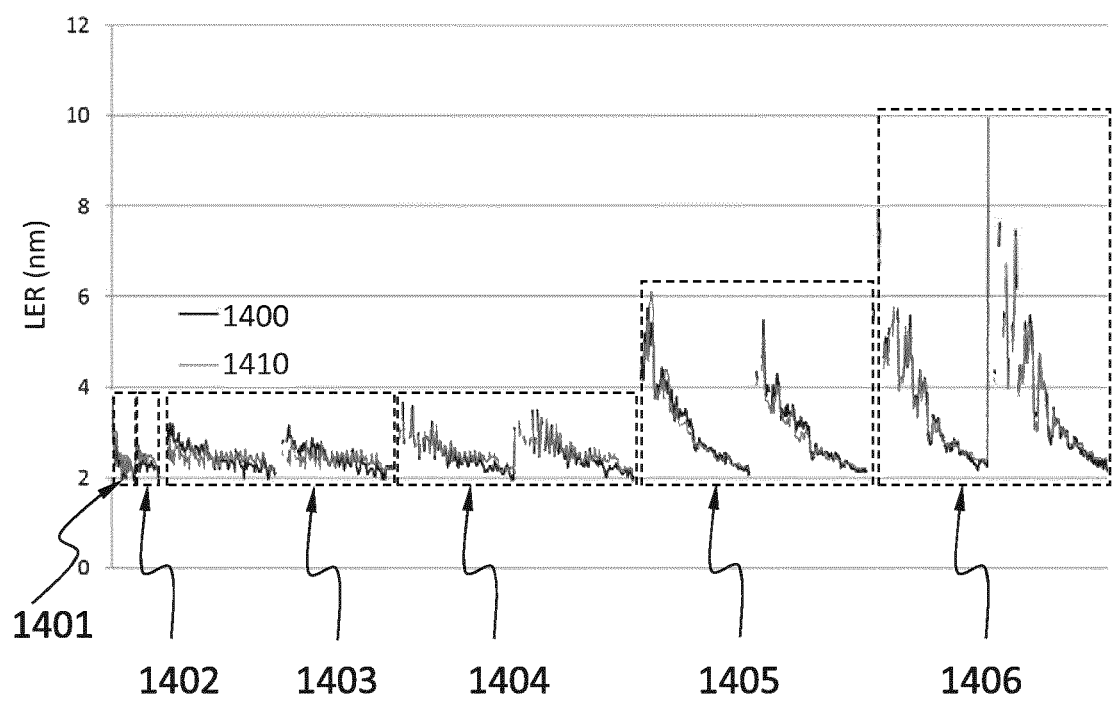
FIG. 5A and FIG. 5B show the result of fitting using the relationship.

FIG. 5A shows a result of fitting using the model in Eq. 30. Values of LER 1400 (as an example of the stochastic variation) of more than 900 different features including long trenches 1401, long lines 1402, short lines 1403, short trenches 1404, short line ends 1405, and short trench ends 1406, at a constant image intensity and a constant dose, are determined following the method in FIG. 4A and FIG. 4B. The parameters a and b in Eq. 30 (parameter c is rolled into parameter a because dose weighted blurred image intensity is constant) are determined by fitting the values of LER with values of the design variable, bl_ILS. The fitting result is shown in curve 1410.

Figure 5B:
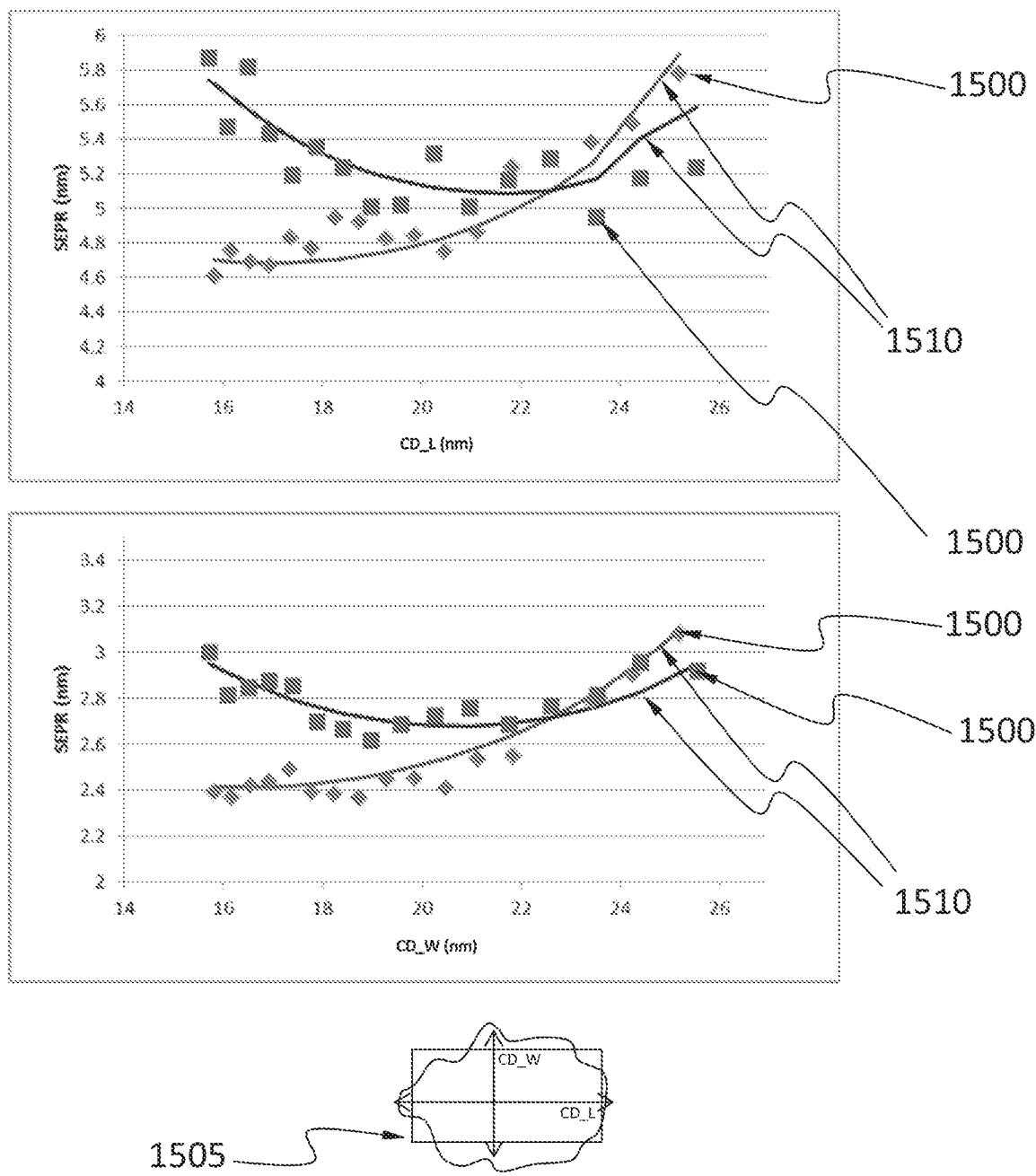

FIG. 5B shows a result of fitting 1510 using the model in Eq. 30. Values of LCDU 1500 (as an example of the stochastic variation) of CD in the width direction and of CD in the length direction of a 20 by 40 nm trench 1505 at a variety of doses and a variety of image intensities are determined using the method in FIG. 4A and FIG. 4B. The parameters a, b and c in Eq. 30 are determined by fitting the values of LWR with values of the design variable, bl_ILS, dose and image intensity.

Figure 6:
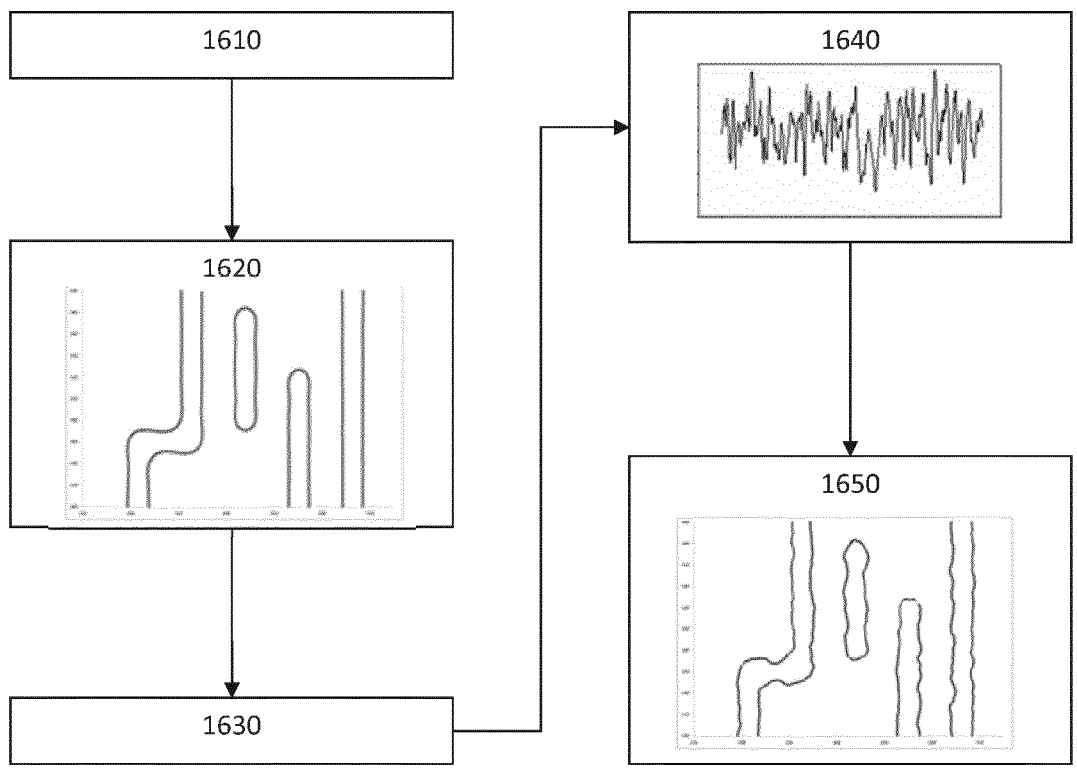
FIG. 6 shows an exemplary flow chart for calculating and illustrating the stochastic variation.

Once the relationship between a stochastic variation of a characteristic of an aerial image or a resist image and one or more design variables is determined by a method such as the method in FIG. 4A and FIG. 4B, a value of the stochastic variation may be calculated for that characteristic using the relationship. FIG. 6 shows an exemplary flow chart for this calculation. In step 1610, a set of conditions (e.g., NA, σ, dose, focus, resist chemistry, one or more projection optics parameters, one or more illumination parameters, etc.) are selected. In step 1620, the values of the one or more design variables are calculated under these conditions. For example, values of edge position of a resist image and bl_ILS along the edges. In step 1630, values of the stochastic variation are calculated from the relationship between the stochastic variation and the one or more design variables. For example, in an example, the stochastic variation is the LER of the edges. In optional step 1640, a noise vector may be defined, whose frequency distribution approximately matches real substrate measurements. In optional step 1650, the noise vector is overlaid on the results (e.g., stochastic edge of the aerial image or resist image).

Figure 7:
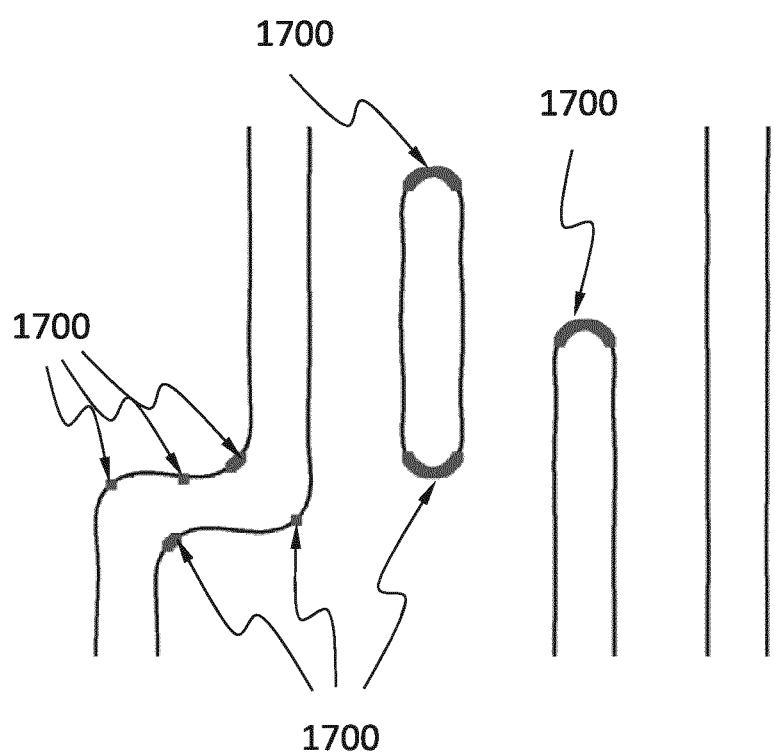
FIG. 7 shows hotspots identified using the stochastic variation.

The relationship between a stochastic variation of a characteristic of an aerial image or a resist image and one or more design variables may also be used to identify one or more "hot spots" of the aerial image or resist image, as shown in FIG. 7. A "hot spot" can be defined as a location on the image where the stochastic variation is beyond a certain magnitude. For example, if two positions on two nearby edges have large values of LER, these two positions have a high chance of joining each other.

Figure 8:
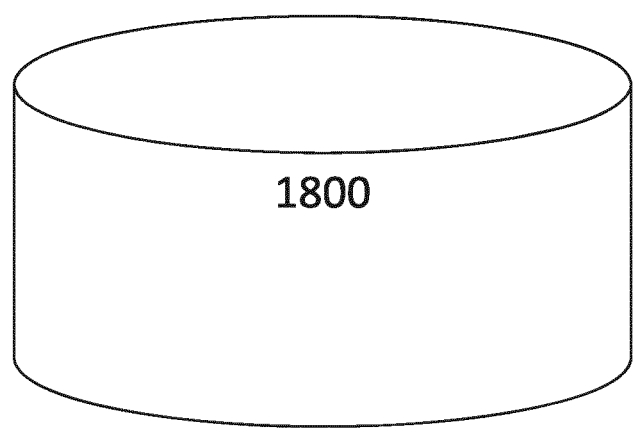
FIG. 8 shows a non-transitory computer-readable medium containing values of a stochastic variation at a plurality of conditions and at a plurality of values of the design variables.

In an example, values of a stochastic variation (and/or a function thereof) at a plurality of conditions and at a plurality of values of the one or more design variables may be calculated and compiled in a non-transitory computer-readable medium 1800, as shown in FIG. 8, such as a database stored on a hard drive. A computer may query the medium 1800 and calculate a value of the stochastic variation from the content of the medium 1800.

Determination of a stochastic variation of a characteristic of an aerial/resist image may be useful in many ways in the lithographic process. In one example, the stochastic variation may be taken into account in optical proximity correction (OPC).

As an example, OPC addresses the fact that the final size and placement of an image of the design layout projected on the substrate will not be identical to, or simply depend only on the size and placement of, the design layout on the patterning device. It is noted that the terms "mask", "reticle", "patterning device" are utilized interchangeably herein. Also, person skilled in the art will recognize that, especially in the context of lithography simulation/optimization, the term "mask"/"patterning device" and "design layout" can be used interchangeably, as in lithography simulation/optimization, a physical patterning device is not necessarily used but a design layout can be used to represent a physical patterning device. For the small feature sizes and high feature densities present on some design layouts, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during, e.g., post-exposure bake (PEB), resist development, and etching that generally follow lithography.

To help ensure that the projected image of the design layout is in accordance with requirements of a given target circuit design, proximity effects should be predicted and compensated for, using a sophisticated numerical model, correction or pre-distortion of the design layout. The article "Full-Chip Lithography Simulation and Design Analysis—How OPC Is Changing IC Design", C. Spence, Proc. SPIE, Vol. 5751, pp 1-14 (2005) provides an overview of "model-based" optical proximity correction processes. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

Application of model-based OPC to a target design involves good process models and considerable computational resources, given the many millions of features typically present in a chip design. However, applying OPC is generally not an "exact science", but an empirical, iterative process that does not always compensate for all possible proximity effects. Therefore, the effect of OPC, e.g., a design layout after application of OPC and/or any other RET, should be verified by design inspection, i.e. intensive full-chip simulation using a calibrated numerical process model, in order to reduce or minimize the possibility of design flaws being built into the patterning device pattern. This is driven by the enormous cost of making high-end patterning devices, which run in the multi-million dollar range, as well as by the impact on turn-around time by reworking or repairing actual patterning devices once they have been manufactured.

Both OPC and full-chip RET verification may be based on numerical modeling systems and methods as described, for example in, U.S. Patent Application Publication No. US 2005-0076322 and an article titled "Optimized Hardware and Software For Fast, Full Chip Simulation", by Y. Cao et al., Proc. SPIE, Vol. 5754, 405 (2005).

One RET is related to adjustment of the global bias (also referred to as "mask bias") of the design layout. The global bias is the difference between the patterns in the design layout and the patterns intended to print on the substrate. For example, ignoring (de-)magnification by projection optics, a circular pattern of 25 nm diameter may be printed on the substrate by a 50 nm diameter pattern in the design layout or by a 20 nm diameter pattern in the design layout but with high dose.

In addition to optimization to design layouts or patterning devices (e.g., OPC), the illumination can also be optimized, either jointly with patterning device optimization or separately, in an effort to improve the overall lithography fidelity. The terms "illumination source" and "source" are used interchangeably in this document. Many off-axis illuminations, such as annular, quadrupole, and dipole, have been introduced, and have provided more freedom for OPC design, thereby improving the imaging results. Off-axis illumination is a way to resolve fine structures (i.e., target features) contained in the patterning device. However, when compared to a traditional illumination, an off-axis illumination usually provides less radiation intensity for the aerial image (AI). Thus, it becomes desirable to attempt to optimize the illumination to achieve the optimal balance between finer resolution and reduced radiation intensity.

Numerous illumination optimization approaches can be found, for example, in an article by Rosenbluth et al., titled "Optimum Mask and Source Patterns to Print a Given Shape", Journal of Microlithography, Microfabrication, Microsystems 1(1), pp. 13-20, (2002). The source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods demonstrate some success, they typically require multiple complicated iterations to converge. In addition, it may be difficult to determine the appropriate/optimal values for some extra parameters, such as γ in Granik's method, which dictates the trade-off between optimizing the source for substrate image fidelity and the smoothness requirement of the source.

For low $k_1$ photolithography, optimization of both the source and patterning device is useful to help ensure a viable process window for projection of critical circuit patterns. Some algorithms (e.g., Socha et. al., Proc. SPIE vol. 5853, 2005, p. 180) discretize illumination into independent source points and the patterning device into diffraction orders in the spatial frequency domain, and separately formulate a cost function (which is defined as a function of one or more selected design variables) based on a process window metric, such as exposure latitude, which could be predicted by an optical imaging model from source point intensities and patterning device diffraction orders.

The term "design variables" as used herein comprises a set of parameters of a lithographic projection apparatus or a lithographic process, for example, parameters a user of the lithographic projection apparatus can adjust, or image characteristics a user can adjust by adjusting those parameters. It should be appreciated that any one or more characteristics of a lithographic projection process, including one or more characteristics of the illumination, the patterning device, the projection optics, and/or resist, can be represented by the design variables in the optimization. The cost function is often a non-linear function of the design variables. Then standard optimization techniques are used to optimize the cost function.

Relatedly, the pressure of ever decreasing design rules have driven semiconductor chipmakers to move deeper into the low $k_1$ lithography era with existing 193 nm ArF lithography. Lithography towards lower $k_1$ puts heavy demands on RET, exposure tools, and the need for litho-friendly design. 1.35 ArF hyper numerical aperture (NA) exposure tools may be used in the future. To help ensure that circuit design can be produced on to the substrate with workable process window, illumination-patterning device optimization (referred to herein as source-mask optimization or SMO) is becoming a significant RET for 2x nm node.

An illumination and patterning device (design layout) optimization method and system that allows for simultaneous optimization of the illumination and patterning device using a cost function without constraints and within a practicable amount of time is described in U.S. Patent Application Publication No. US 2011-0230999, which is hereby incorporated by reference in its entirety. Another SMO method and system that involves optimizing the source by adjusting pixels of the source is described in U.S. Patent Application Publication No. 2010/0315614, which is hereby incorporated by reference in its entirety.

In a lithographic projection apparatus, as an example, a cost function may be expressed as $$CF(z_1, z_2, \ldots, z_N) = \sum_{p=1}^{P} w_p f_p^2(z_1, z_2, \ldots, z_N) \qquad \text{(Eq. 1)}$$

wherein $(z_1, z_2, \ldots, z_N)$ are N design variables or values thereof. $f_p(z_1, z_2, \ldots, z_N)$ can be a function of the design variables $(z_1, z_2, \ldots, z_N)$ such as a difference between an actual value and an intended value of a characteristic at an evaluation point for a set of values of the design variables of $(z_1, z_2, \ldots, z_N)$. $w_p$ is a weight constant associated with $f_p(z_1, z_2, \ldots, z_N)$. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the substrate, any point on a virtual design layout, or resist image, or aerial image, or a combination thereof. $f_p(z_1, z_2, \ldots, z_N)$ can also be a function of one or more stochastic variations such as the LWR, LER, and/or LCDU, which are in turn functions of the design variables $(z_1, z_2, \ldots, z_N)$. $f_p(z_1, z_2, \ldots, z_N)$ may be an explicit function of a stochastic variation, such as $f_p(LER)=LER^2 (z_1, z_2, \ldots, z_N)$. $f_p(z_1, z_2, \ldots, z_N)$ may be an explicit function of a variable that is a function of a stochastic variation such as LER. For example, bl_ILS may be a function of LER as indicated by Eq. 30 and $$f_p(bl\_ILS(LER)) = f_p\left(\sqrt[c]{\frac{LER}{\alpha \times (dose \times image\ intensity)^c}}\right) \cdot f_p(z_1, z_2, \ldots, z_N)$$

may be a variable that affects a stochastic variation such as LER.

So, optimization using a cost function that includes $f_p(z_1, z_2, \ldots, z_N)$ that represents a stochastic variation may lead to values of the one or more design variables that reduce or minimize the stochastic variation. The cost function may represent any one or more suitable characteristics of the lithographic projection apparatus, lithographic process or the substrate, for instance, focus, CD, image shift, image distortion, image rotation, stochastic variation, throughput, LCDU, or a combination thereof. LCDU is local CD variation (e.g., three times of the standard deviation of the local CD distribution). In one example, the cost function represents (i.e., is a function of) LCDU, throughput, and the stochastic variations. In one example, the cost function represents (e.g., includes a $f_p(z_1, z_2, \ldots, z_N)$ that is a function of) EPE, throughput, and the stochastic variations. In one example, the cost function includes a $f_p(z_1, z_2, \ldots, z_N)$ that is a function of EPE and a $f_p(z_1, z_2, \ldots, z_N)$ that is a function of a stochastic variation such as LER. In one example, the design variables $(z_1, z_2, \ldots, z_N)$ comprise one or more selected from dose, global bias of the patterning device, shape of illumination, or a combination thereof. Since it is the resist image that often dictates the pattern on a substrate, the cost function may include a function that represents one or more characteristics of the resist image. For example, $f_p(z_1, z_2, \ldots, z_N)$ of such an evaluation point can be simply a distance between a point in the resist image to an intended position of that point (i.e., edge placement error $EPE_p(z_1, z_2, \ldots, z_N)$). The design variables can include any adjustable parameter such as an adjustable parameter of the source, the patterning device, the projection optics, dose, focus, etc.

The lithographic apparatus may include components collectively called as "wavefront manipulator" that can be used to adjust the shape of a wavefront and intensity distribution and/or phase shift of a radiation beam. In an example, the lithographic apparatus can adjust a wavefront and intensity distribution at any location along an optical path of the lithographic projection apparatus, such as before the patterning device, near a pupil plane, near an image plane, and/or near a focal plane. The wavefront manipulator can be used to correct or compensate for certain distortions of the wavefront and intensity distribution and/or phase shift caused by, for example, the source, the patterning device, temperature variation in the lithographic projection apparatus, thermal expansion of components of the lithographic projection apparatus, etc. Adjusting the wavefront and intensity distribution and/or phase shift can change values of the evaluation points and the cost function. Such changes can be simulated from a model or actually measured. Of course, $CF(z_1, z_2, \ldots, z_N)$ is not limited to the form in Eq. 1. $CF(z_1, z_2, \ldots, z_N)$ can be in any other suitable form.

According to an example, a cost function representing both EPE and LER may have the form:

$$CF(z_1, z_2, \ldots, z_N) = \sum_{p=1}^{P} (w_p EPE_p^2(z_1, z_2, \ldots, z_N) + s_p LER_p^2(z_1, z_2, \ldots, z_N))$$

This is because EPE and LER both have a dimension of length. Therefore, they can be directly added. Alternative cost functions may be used, including cost functions in which LER is included in EPE.

Eq. 30 links bl_ILS to LER. Therefore, optimization using a cost function representing bl_ILS is similar to optimization using a cost function representing LER. Greater bl_ILS leads to lesser LER and vice versa. According to an example, a cost function may represent both EPE and bl_ILS (or normalized ILS (NILS)). However, EPE and bl_ILS (or NILS) might not be added directly because bl_ILS does not measure a length and EPE does, or NILS is dimensionless and EPE has a dimension of length. Therefore, representing bl_ILS (or NILS) by a function that represents a length makes directly adding that representation to EPE possible.

Figure 9A:
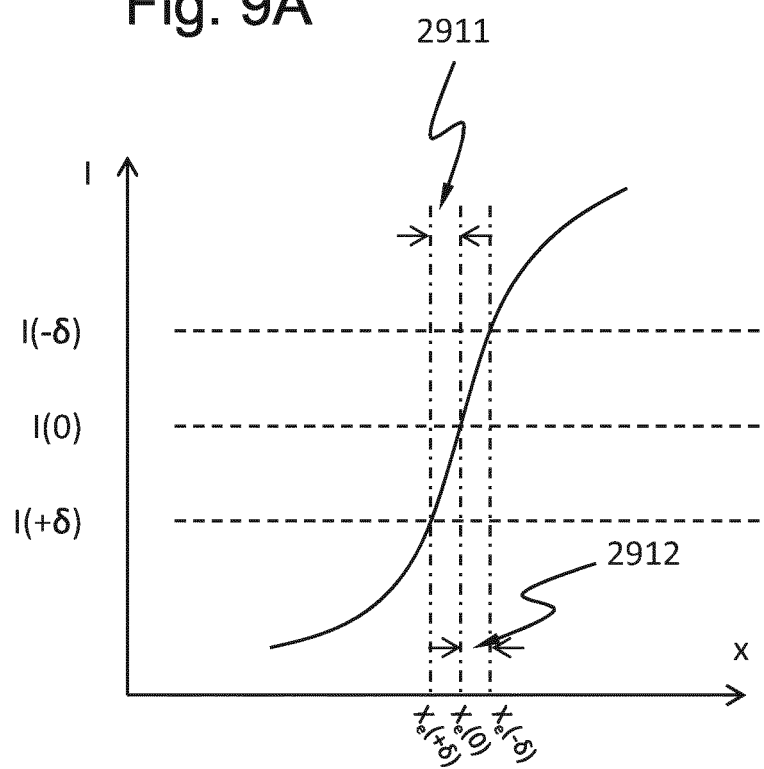
FIG. 9A and FIG. 9B each shows intensity of an image (aerial or resist) across an edge of a pattern in a direction (x) perpendicular to that edge.
Figure 9B:
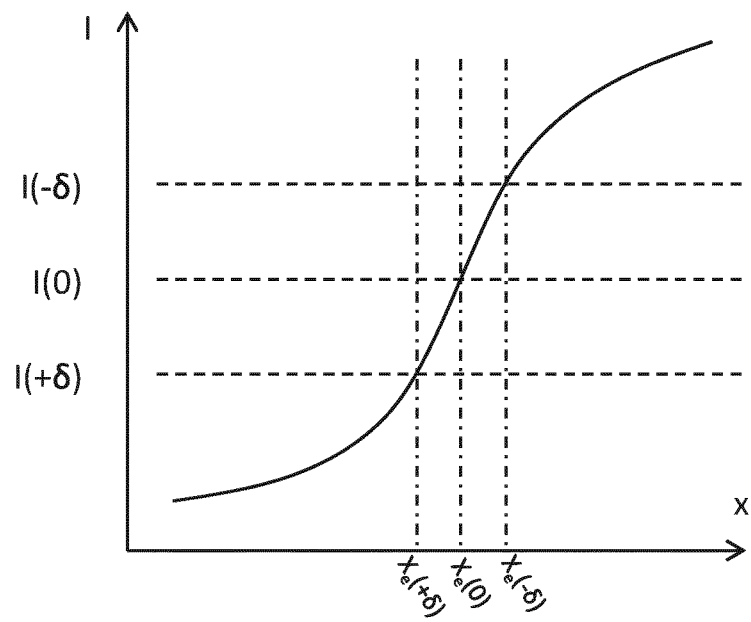

ILS is defined as $ILS=\partial \ln I/\partial x$. bl_ILS is spatially blurred ILS. NILS is defined as $=CD \times ILS$. These definitions suggest a function that can represent ILS, bl_ILS or NILS and represents a length, and thus allows directly adding to EPE. FIG. 9A and FIG. 9B each shows intensity of an image (aerial or resist) across an edge of a pattern in a direction (x) perpendicular to that edge. Higher slope of the intensity with respect to x means higher ILS, bl_ILS and NILS. The example of FIG. 9A thus has a higher ILS, bl_ILS and NILS than the example of FIG. 9B. The edge location $X_e$ shifts with the intensity sufficient to expose the resist I. The intensity sufficient to expose the resist I changes with the dose, when the duration of exposure is fixed. Therefore, the amount of shift ("$EPE_{ILS}$" hereafter, e.g., 2911 and 2912) of the edge location $X_e$ caused by a given amount of change in the dose (e.g., $\pm\delta$ relative to nominal dose, which may be a parameter a user chooses) is determined by ILS, bl_ILS or NILS. The $EPE_{ILS}$ in the example of FIG. 9A is smaller than the $EPE_{ILS}$ in the example of FIG. 9B because the example of FIG. 9A thus has a higher ILS, bl_ILS and NILS than the example of FIG. 9B. The $EPE_{ILS}$ is thus an example of a function that can represent ILS, bl_ILS or NILS and represents a length, allowing directly adding to EPE in a cost function. $EPE_{ILS}$ can be written as $$EPE_{ILS} = \frac{1}{ILS(x_e(0))}\left(\frac{1}{1+\delta} - 1\right) \cong \frac{1}{ILS(x_e(0))}(-\delta).$$

where $ILS(x_e(0))$ is a function of the design variables $(z_1, z_2, \ldots, z_N)$. A cost function that represents both EPE and ILS, bl_ILS or NILS, according to an example, may have the form:

$$CF(z_1, z_2, \ldots, z_N) = \sum_{p=1}^{P} \left( w_p EPE_p^2(z_1, z_2, \ldots, z_N)|_{\delta=0} + s_p(EPE_{ILS})^2 \right) =$$

$$\sum_{p=1}^{P} \left( w_p EPE_p^2(z_1, z_2, \ldots, z_N)|_{\delta=0} + s_p \left( \frac{\delta}{ILS(x_e(0))} \right)^2 \right).$$

where $EPE_p(z_1, z_2, \ldots, z_N)|_{\delta=0}$ is the EPE value at the nominal dose, p is the p-th evaluation point, and $S_p$ is the weight for the $EPE_{ILS}$ term. So, for example, optimization by minimizing this cost function maximizes $ILS(x_e(0))$, and thus minimizes LER.

According to an example, the weight of the $EPE_{ILS}$ term $$\left( \frac{\delta}{ILS(x_e(0))} \right)^2$$

can be reduced relative to the weight of the EPE terms (e.g., $EPE_p^2$) when the EPE terms increase, so that the $EPE_{ILS}$ term $$\left( \frac{\delta}{ILS(x_e(0))} \right)^2$$

does not dominate the EPE terms $EPE_p^2$. If the $EPE_{ILS}$ term dominates, the EPE terms will not be reduced sufficiently by the optimization. For example, when $|EPE_p|$ is above a user-selected offset, $s_p=0$ when $|EPE_p|>OF$ (thereby the optimization ignores the $EPE_{ILS}$ term and only reduces the EPE terms) and $s_p \neq 0$ when $|EPE_p| \leq OF$, where OF is the offset. For example, $$w_p = \begin{cases} w_{default}, & \text{when } |EPE_p| \leq OF \\ w_{default} + w_{offset}, & \text{when } |EPE_p| > OF \end{cases}.$$

Higher weight of the EPE terms will make the optimization favor reduction of the EPE terms in the optimization using the cost function.

Figure 10:
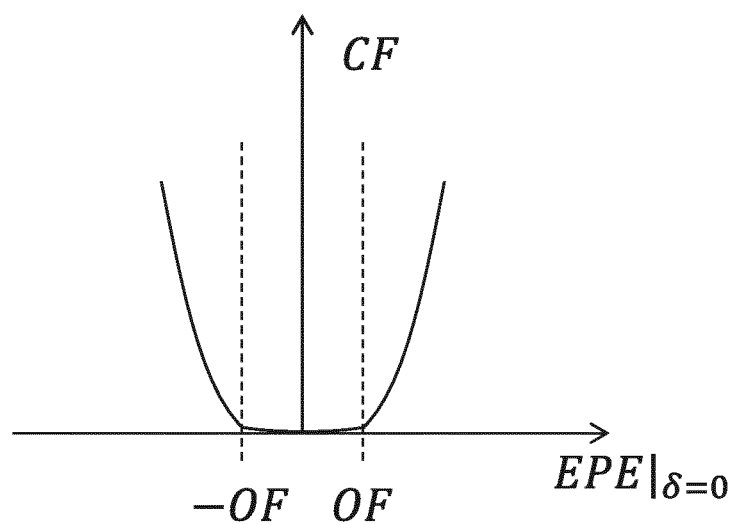
FIG. 10 schematically shows curves of an $EPE_{ILS}$ term.

FIG. 10 schematically shows the curves of the cost function as a function of $EPE_p$ where the weight $$w_p = \begin{cases} w_{default}, & \text{when } |EPE_p| \leq OF \\ w_{default} + w_{offset}, & \text{when } |EPE_p| > OF \end{cases}.$$

As FIG. 10 shows, the EPE terms account for a greater proportion of the cost function when $|EPE_p|>OF$ because the weight $w_p$ has a greater value.

The design variables may have constraints, which can be expressed as $(z_1, z_2, \ldots, z_N) \in Z$, where Z is a set of possible values of the design variables. One possible constraint on the design variables may be imposed by a desired throughput of the lithographic projection apparatus. A lower bound of desired throughput leads to an upper bound on the dose and thus has implications for the stochastic variation (e.g., imposing a lower bound on the stochastic variation). Shorter exposure time and/or lower dose generally leads to higher throughput but greater stochastic variation. Consideration of substrate throughput and minimization of the stochastic variation may constrain the possible values of design variables because the stochastic variation is a function of the design variables. Without such a constraint imposed by the desired throughput, the optimization may yield a set of values of the design variables that are unrealistic. For example, if the dose is a design variable, without such a constraint, the optimization may yield a dose value that makes the throughput economically impossible. However, the usefulness of constraints should not be interpreted as a necessity. For example, the throughput may be affected by the pupil fill ratio. For some illumination designs, a low pupil fill ratio may discard radiation, leading to lower throughput. Throughput may also be affected by the resist chemistry. Slower resist (e.g., a resist that requires higher amount of radiation to be properly exposed) leads to lower throughput.

The optimization process therefore is to find a set of values of the one or more design variables, under the constraints $(z_1, z_2, \ldots, z_N) \in Z$, that optimize the cost function, e.g., to find:

$$(\tilde{z}_1, \tilde{z}_2, \ldots, \tilde{z}_N) = \arg \min_{(z_1, z_2, \ldots, z_N) \in Z} CF(z_1, z_2, \ldots, z_N) \quad \text{(Eq. 2)}$$

Figure 11:
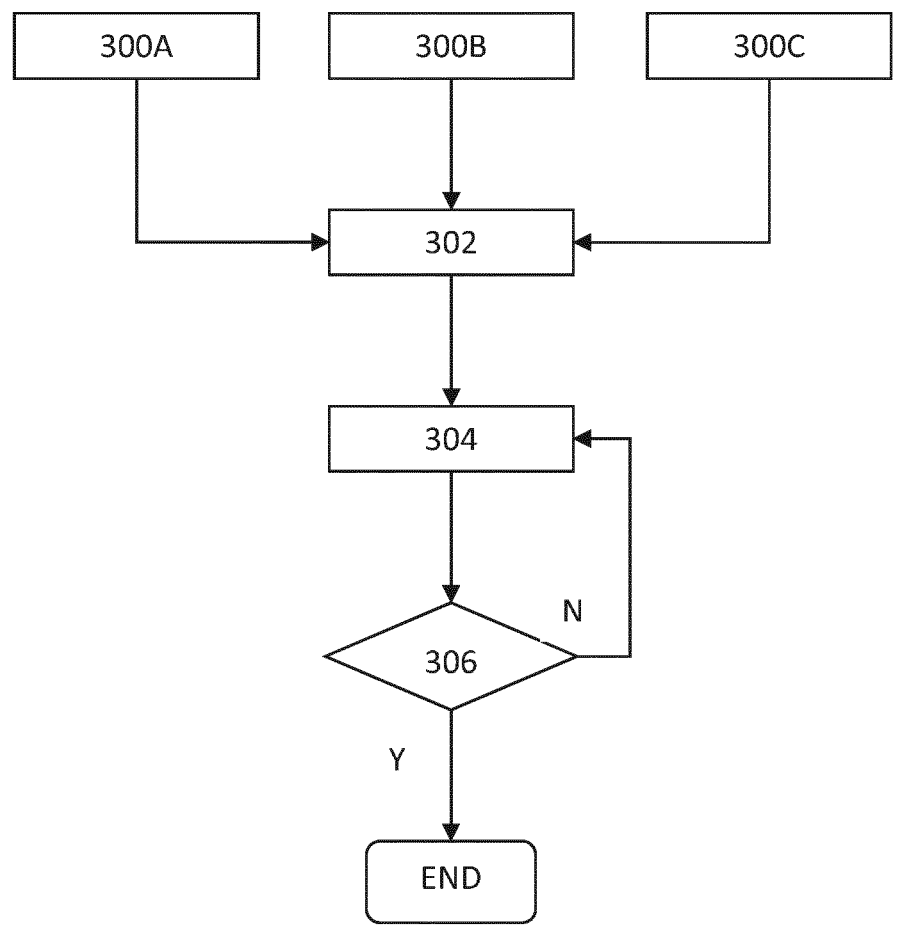
FIG. 11 is a flow diagram illustrating aspects of an example methodology of joint optimization/co-optimization.
Figure 22:
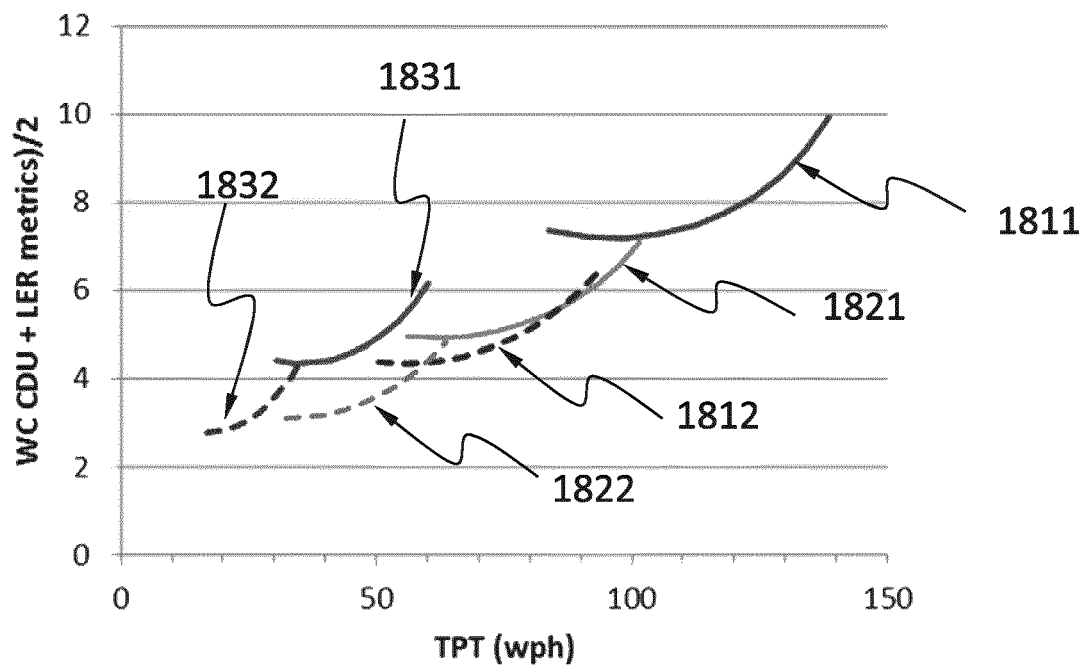
FIG. 22 shows several relations of the throughput and a measure of the stochastic variation.

A general method of optimizing, according to an example, is illustrated in FIG. 11. This method comprises a step 302 of defining a multi-variable cost function of a plurality of design variables. The design variables may comprise any suitable combination selected from design variables representing one or more characteristics of the illumination (300A) (e.g., pupil fill ratio, namely percentage of radiation of the illumination that passes through a pupil or aperture), one or more characteristics of the projection optics (300B) and/or one or more characteristics of the design layout (300C). For example, the design variables may include design variables representing one or more characteristics of the illumination (300A) and of the design layout (300C) (e.g., global bias) but not of one or more characteristics of the projection optics (300B), which leads to a SMO. Or, the design variables may include design variables representing one or more characteristics of the illumination (300A) (optionally polarization), of the projection optics (300B) and of the design layout (300C), which leads to a illumination-patterning device (e.g., mask)-projection system (e.g., lens) optimization (SMLO). In step 304, the design variables are simultaneously adjusted so that the cost function is moved towards convergence. In step 306, it is determined whether a predefined termination condition is satisfied. The predetermined termination condition may include various possibilities, e.g., one or more selected from: the cost function may be minimized or maximized, as required by the numerical technique used, the value of the cost function has been equal to a threshold value or has crossed the threshold value, the value of the cost function has reached within a preset error limit, and/or a preset number of iterations is reached. If a condition in step 306 is satisfied, the method ends. If the one or more conditions in step 306 is not satisfied, the steps 304 and 306 are iteratively repeated until a desired result is obtained. The optimization does not necessarily lead to a single set of values for the one or more design variables because there may be a physical restraint, caused by a factor such as pupil fill factor, resist chemistry, throughput, etc. The optimization may provide multiple sets of values for the one or more design variables and associated performance characteristics (e.g., the throughput) and allows a user of the lithographic apparatus to pick one or more sets. FIG. 22 shows several relations of the throughput (in the unit of number of substrates per hour) in the horizontal axis and a measure of the stochastic variation, for example, the average of the worst corner CDU and LER in the vertical axis, to resist chemistry (which may be represented by the dose required to expose the resist), pupil fill ratio (also known as "pupil fill factor"), illumination efficiency (e.g., the ratio of mirrors that direct radiation to the patterning device and the total available mirrors in the illuminator) and mask bias. Trace 1811 shows these relations with 100% pupil fill factor and a fast resist. Trace 1812 shows these relations with 100% pupil fill factor and a slow resist. Trace 1821 shows these relations with 60% pupil fill factor and the fast resist. Trace 1822 shows these relations with 60% pupil fill factor and the slow resist. Trace 1831 shows these relations with 29% pupil fill factor and the fast resist. Trace 1832 shows these relations with 29% pupil fill factor and the slow resist. The optimization may present all these possibilities to the user so the user may choose the pupil factor, the resist chemistry based on his specific requirement of the stochastic variation and/or throughput. The optimization may further include calculating a relation between a throughput and a pupil fill factor, resist chemistry and a mask bias. The optimization may further include calculating a relation between a measure of a stochastic variation and a pupil fill factor, resist chemistry and a mask bias.

Figure 23:
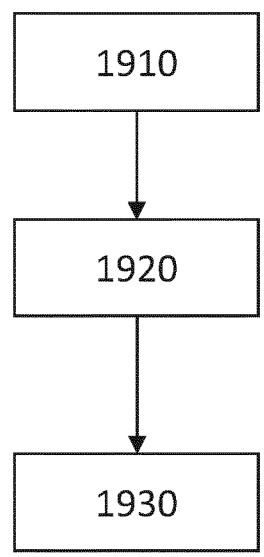
FIG. 23 schematically illustrates a flow chart of a method that carries out optimization for a set of values of one or more design variables and presents various characteristics of the process, the aerial image, and/or resist image to a user so that the user can select a set of values of the one or more design variables based on the user's desired characteristic.

According to an example, also as schematically illustrated in the flow chart of FIG. 23, an optimization may be carried out under each of a set of values of the one or more design variables (e.g., an array, a matrix, or a list of values of the global bias and mask anchor bias) (Step 1910). In an example, the cost function of the optimization is a function of one or more measures (e.g., LCDU) of the stochastic variation. Then, in step 1920, various characteristics of the process, the aerial image, and/or resist image (e.g., critical dimension uniformity (CDU), depth of focus (DOF), exposure latitude (EL), mask error enhancement factor (MEEF), LCDU, throughput, etc.) may be presented (e.g., in a 3D plot) to a user of the optimization for each set of values of the one or more design variables. In optional step 1930, the user selects a set of values of the one or more design variables based on his one or more desired characteristics. The flow may be implemented via an XML file or any script language.

The illumination, patterning device and projection optics can be optimized alternatively (referred to as Alternative Optimization) or optimized simultaneously (referred to as Simultaneous Optimization). The terms "simultaneous", "simultaneously", "joint" and "jointly" as used herein mean that the one or more design variables representing one or more characteristics of the illumination, patterning device, projection optics and/or any other design variable, are allowed to change at the same time. The term "alternative" and "alternatively" as used herein mean that not all of the design variables are allowed to change at the same time.

Figure 12:
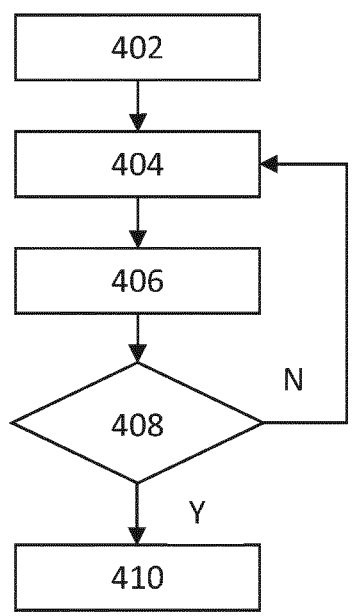
FIG. 12 shows an example of a further optimization method.

In FIG. 11, the optimization of all the design variables is executed simultaneously. Such a flow may be called simultaneous flow or co-optimization flow. Alternatively, the optimization of all the design variables is executed alternatively, as illustrated in FIG. 12. In this flow, in each step, some design variables are fixed while other design variables are optimized to optimize the cost function; then in the next step, a different set of variables are fixed while the others are optimized to minimize or maximize the cost function. These steps are executed alternatively until convergence or a certain terminating condition is met. As shown in the non-limiting example flowchart of FIG. 12, first, a design layout (step 402) is obtained, then a step of illumination optimization is executed in step 404, where the one or more design variables of the illumination are optimized (SO) to minimize or maximize the cost function while other design variables are fixed. Then in the next step 406, a patterning device (e.g., mask) optimization (MO) is performed, where the design variables of the patterning device are optimized to minimize or maximze the cost function while other design variables are fixed. These two steps are executed alternatively, until a certain terminating condition is met in step 408. One or more various termination conditions can be used, such as the value of the cost function becomes equal to a threshold value, the value of the cost function crosses the threshold value, the value of the cost function reaches within a preset error limit, a preset number of iterations is reached, etc. Note that SO-MO-Alternative-Optimization is used as an example for the alternative flow. The alternative flow can take many different forms, such as SO-LO-MO-Alternative-Optimization, where SO, LO (projection optics optimization) is executed, and MO alternatively and iteratively; or first SMO can be executed once, then execute LO and MO alternatively and iteratively; and so on. Another alternative is SO-PO-MO (illumination optimization, polarization optimization and patterning device optimization). Finally the output of the optimization result is obtained in step 410, and the process stops.

The pattern selection algorithm, as discussed before, may be integrated with the simultaneous or alternative optimization. For example, when an alternative optimization is adopted, first a full-chip SO can be performed, one or more 'hot spots' and/or 'warm spots' are identified, then a MO is performed. In view of the present disclosure numerous permutations and combinations of sub-optimizations are possible in order to achieve the desired optimization results.

Figure 13A:
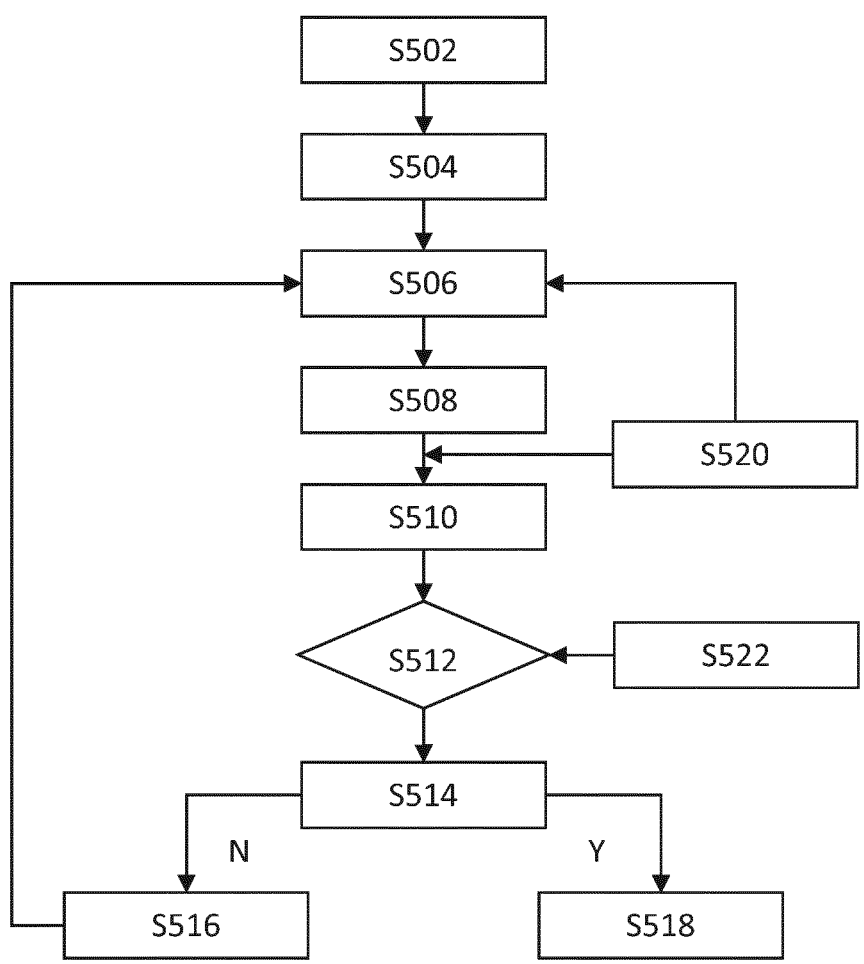
FIG. 13A, FIG. 13B and FIG. 14 show example flowcharts of various optimization processes.

FIG. 13A shows one exemplary method of optimization, where a cost function is minimized or maximized. In step S502, initial values of one or more design variables are obtained, including one or more associated tuning ranges, if any. In step S504, the multi-variable cost function is set up. In step S506, the cost function is expanded within a small enough neighborhood around the starting point value of the one or more design variables for the first iterative step (i=0). In step S508, standard multi-variable optimization techniques are applied to the cost function. Note that the optimization problem can apply constraints, such as the one or more tuning ranges, during the optimization process in S508 or at a later stage in the optimization process. Step S520 indicates that each iteration is done for the one or more given test patterns (also known as "gauges") for the identified evaluation points that have been selected to optimize the lithographic process. In step S510, a lithographic response is predicted. In step S512, the result of step S510 is compared with a desired or ideal lithographic response value obtained in step S522. If the termination condition is satisfied in step S514, i.e. the optimization generates a lithographic response value sufficiently close to the desired value, then the final value of the design variables is outputted in step S518. The output step may also include outputting one or more other functions using the final values of the design variables, such as outputting a wavefront aberration-adjusted map at the pupil plane (or other planes), an optimized illumination map, and/or optimized design layout etc. If the termination condition is not satisfied, then in step S516, the values of the one or more design variables is updated with the result of the i-th iteration, and the process goes back to step S506. The process of FIG. 13A is elaborated in details below.

In an exemplary optimization process, no relationship between the design variables $(z_1, z_2, \ldots, z_N)$ and $f_p(z_1, z_2, \ldots, z_N)$ is assumed or approximated, except that $f_p(z_1, z_2, \ldots, z_N)$ is sufficiently smooth (e.g. first order derivatives $$\frac{\partial f_p(z_1, z_2, \ldots, z_N)}{\partial z_n},$$

(n=1, 2, . . . N) exist), which is generally valid in a lithographic projection apparatus. An algorithm, such as the Gauss-Newton algorithm, the Levenberg-Marquardt algorithm, the Broyden-Fletcher-Goldfarb-Shanno algorithm, the gradient descent algorithm, the simulated annealing algorithm, the interior point algorithm, and the genetic algorithm, can be applied to find $(\tilde{z}_1, \tilde{z}_2, \ldots, \tilde{z}_N)$.

Here, the Gauss-Newton algorithm is used as an example. The Gauss-Newton algorithm is an iterative method applicable to a general non-linear multi-variable optimization problem. In the i-th iteration wherein the design variables $(z_1, z_2, \ldots, z_N)$ take values of $(z_{1i}, z_{2i}, \ldots, z_{Ni})$, the Gauss-Newton algorithm linearizes $f_p(z_1, z_2, \ldots, z_N)$ in the vicinity of $(z_{1i}, z_{2i}, \ldots, z_{Ni})$, and then calculates values $(z_{1(i+1)}, z_{2(i+1)}, \ldots, z_{N(i+1)})$ in the vicinity of $(z_{1i}, z_{2i}, \ldots, z_{Ni})$ that give a minimum of $CF(z_1, z_2, \ldots, z_N)$. The design variables $(z_1, z_2, \ldots, z_N)$ take the values of $(z_{1(i+1)}, z_{2(i+1)}, \ldots, z_{N(i+1)})$ in the (i+1)-th iteration. This iteration continues until convergence (i.e. $CF(z_1, z_2, \ldots, z_N)$. does not reduce any further) or a preset number of iterations is reached.

Specifically, in the i-th iteration, in the vicinity of $(z_{1i}, z_{2i}, \ldots, z_{Ni})$, $$f_p(z_1, z_2, \ldots, z_N) \approx f_p(z_{1i}, z_{2i}, \ldots, z_{Ni}) + \quad \text{(Eq. 3)}$$

$$\sum_{n=1}^{N} \frac{\partial f_p(z_1, z_2, \ldots, z_N)}{\partial z_n}\bigg|_{z_1=z_{1i}, z_2=z_{2i}, \ldots z_N=z_{Ni}} (z_n = z_{ni})$$

Under the approximation of Eq. 3, the cost function becomes:

$$CF(z_1, z_2, \ldots, z_N) = \sum_{p=1}^{P} w_p f_p^2(z_1, z_2, \ldots, z_N) \quad \text{(Eq. 4)}$$

$$= \sum_{p=1}^{P} w_p \left( \begin{array}{c} f_p(z_{1i}, z_{2i}, \ldots, z_{Ni}) + \\ \sum_{n=1}^{N} \frac{\partial f_p(z_1, z_2, \ldots, z_N)}{\partial z_n}\bigg|_{z_1=z_{1i}, z_2=z_{2i}, \ldots z_N=z_{Ni}} \\ (z_n = z_{ni}) \end{array} \right)^2$$

which is a quadratic function of the design variables $(z_1, z_2, \ldots, z_N)$. Every term is constant except the design variables $(z_1, z_2, \ldots, z_N)$.

If the design variables $(z_1, z_2, \ldots, z_N)$ are not under any constraints, $(z_{1(i+1)}, z_{2(i+1)}, \ldots, z_{N(i+1)})$ can be derived by solving N linear equations:

$$\frac{\partial CF(z_1, z_2, \ldots, z_N)}{\partial z_n} = 0,$$

wherein $n = 1, 2, \ldots, N$.

If the design variables $(z_1, z_2, \ldots, z_N)$ are under constraints in the form of J inequalities (e.g. tuning ranges of $(z_1, z_2, \ldots, z_N)$) $\sum_{n=1}^{N} A_{nj} z_n \leq B_j$, for j=1,2, . . . ,J; and K equalities (e.g. interdependence between the design variables) $\sum_{n=1}^{N} C_{nk} z_n \leq D_k$, for k=1, 2, . . . , K, the optimization process becomes a classic quadratic programming problem, wherein $A_{nj}, B_j, C_{nk}, D_k$ are constants. Additional constraints can be imposed for each iteration. For example, a "damping factor" $\Delta_D$, can be introduced to limit the difference between $(z_{1(i+1)}, z_{2(i+1)}, \ldots, z_{N(i+1)})$ and $(z_{1i}, z_{2i}, \ldots, z_{Ni})$ so that the approximation of Eq. 3 holds. Such constraints can be expressed as $z_{ni} - \Delta_D \leq z_n \leq z_{ni} + \Delta_D$. $(z_{1(i+1)}, z_{2(i+1)}, \ldots, z_{N(i+1)})$ can be derived using, for example, methods described in Numerical Optimization ($2^{nd}$ ed.) by Jorge Nocedal and Stephen J. Wright (Berlin New York: Vandenberghe. Cambridge University Press).

Instead of minimizing the RMS of $f_p(z_1, z_2, \ldots, z_N)$, the optimization process can minimize magnitude of the largest deviation (the worst defect) among the evaluation points to their intended values. In this approach, the cost function can alternatively be expressed as $$CF(z_1, z_2, \ldots, z_N) = \max_{1 \leq p \leq P} \frac{f_p(z_1, z_2, \ldots, z_N)}{CL_p} \quad \text{(Eq. 5)}$$

wherein $CL_p$ is the maximum allowed value for $f_p(z_1, z_2, \ldots, z_N)$. This cost function represents the worst defect among the evaluation points. Optimization using this cost function minimizes magnitude of the worst defect. An iterative greedy algorithm can be used for this optimization.

The cost function of Eq. 5 can be approximated as:

$$CF(z_1, z_2, \ldots, z_N) = \sum_{p=1}^{P} w_p \left( \frac{f_p(z_1, z_2, \ldots, z_N)}{CL_p} \right)^q \quad \text{(Eq. 6)}$$

wherein q is an even positive integer such as at least 4, or at least 10. Eq. 6 mimics the behavior of Eq. 5, while allowing the optimization to be executed analytically and accelerated by using methods such as the deepest descent method, the conjugate gradient method, etc.

Minimizing the worst defect size can also be combined with linearizing of $f_p(z_1, z_2, \ldots, z_N)$. Specifically, $f_p(z_1, z_2, \ldots, z_N)$ is approximated as in Eq. 3. Then the constraints on worst defect size are written as inequalities $E_{Lp} \leq f_p(z_1, z_2, \ldots, z_N) \leq E_{Up}$, wherein $E_{LP}$ and $E_{Up}$, are two constants specifying the minimum and maximum allowed deviation for the $f_p(z_1, z_2, \ldots, z_N)$. Plugging Eq. 3 in, these constraints are transformed to, for p=1, . . . P, $$\sum_{n=1}^{N} \frac{\partial f_p(z_1, z_2, \ldots, z_N)}{\partial z_n}\bigg|_{z_1=z_{1i}, z_2=z_{2i}, \ldots z_N=z_{Ni}} \quad \text{(Eq. 6')}$$

$$z_n \leq E_{Up} + \sum_{n=1}^{N} \frac{\partial f_p(z_1, z_2, \ldots, z_N)}{\partial z_n}\bigg|_{z_1=z_{1i}, z_2=z_{2i}, \ldots z_N=z_{Ni}}$$

$$z_{ni} - f_p(z_{1i}, z_{2i}, \ldots, z_{Ni}) \text{ and}$$

$$-\sum_{n=1}^{N} \frac{\partial f_p(z_1, z_2, \ldots, z_N)}{\partial z_n}\bigg|_{z_1=z_{1i}, z_2=z_{2i}, \ldots z_N=z_{Ni}} \quad \text{(Eq. 6'')}$$

$$z_n \leq -E_{Up} - \sum_{n=1}^{N} \frac{\partial f_p(z_1, z_2, \ldots, z_N)}{\partial z_n}\bigg|_{z_1=z_{1i}, z_2=z_{2i}, \ldots z_N=z_{Ni}}$$

$$z_{ni} + f_p(z_{1i}, z_{2i}, \ldots, z_{Ni})$$

Since Eq. 3 is generally valid only in the vicinity of $(z_1, z_2, \ldots, z_N)$, in case the desired constraints $E_{Lp} \leq f_p(z_1, z_2, \ldots, z_N) \leq E_{Up}$ cannot be achieved in such vicinity, which can be determined by any conflict among the inequalities, the constants $E_{Lp}$ and $E_{Up}$ can be relaxed until the constraints are achievable. This optimization process minimizes the worst defect size in the vicinity of $(z_1, z_2, \ldots, z_N)$, i. Then each step reduces the worst defect size gradually, and each step is executed iteratively until certain terminating conditions are met. This will lead to optimal reduction of the worst defect size.

Another way to minimize the worst defect is to adjust the weight $w_p$ in each iteration. For example, after the i-th iteration, if the r-th evaluation point is the worst defect, $w_r$ can be increased in the (i+1)-th iteration so that the reduction of that evaluation point's defect size is given higher priority.

In addition, the cost functions in Eq. 4 and Eq. 5 can be modified by introducing a Lagrange multiplier to achieve compromise between the optimization on RMS of the defect size and the optimization on the worst defect size, i.e., $$CF(z_1, z_2, \ldots, z_N) = (1-\lambda)\sum_{p=1}^{P} w_p f_p^2(z_1, z_2, \ldots, z_N) + \quad \text{(Eq. 6''')}$$

$$\lambda \max_{1 \leq p \leq P} \frac{f_p(z_1, z_2, \ldots, z_N)}{CL_p}$$

where $\lambda$ is a preset constant that specifies the trade-off between the optimization on RMS of the defect size and the optimization on the worst defect size. In particular, if $\lambda=0$, then this becomes Eq. 4 and the RMS of the defect size is only minimized; while $\lambda=1$, then this becomes Eq. 5 and the worst defect size is only minimized; if $0<\lambda<1$, then both are taken into consideration in the optimization. Such optimization can be solved using multiple methods. For example, the weighting in each iteration may be adjusted, similar to the one described previously. Alternatively, similar to minimizing the worst defect size from inequalities, the inequalities of Eq. 6' and 6'' can be viewed as constraints of the design variables during solution of the quadratic programming problem. Then, the bounds on the worst defect size can be relaxed incrementally or increase the weight for the worst defect size incrementally, compute the cost function value for every achievable worst defect size, and choose the design variable values that minimize the total cost function as the initial point for the next step. By doing this iteratively, the minimization of this new cost function can be achieved.

Optimizing a lithographic projection apparatus can expand the process window. A larger process window provides more flexibility in process design and chip design. The process window can be defined as a set of focus and dose values for which the resist image is within a certain limit of the design target of the resist image. Note that all the methods discussed here may also be extended to a generalized process window definition that can be established by different or additional base parameters in addition to exposure dose and defocus. These may include, but are not limited to, optical settings such as NA, sigma, aberration, polarization, or an optical constant of the resist layer. For example, as described earlier, if the process window (PW) also comprises different mask bias, then the optimization includes the minimization of MEEF, which is defined as the ratio between the substrate EPE and the induced mask edge bias. The process window defined on focus and dose values only serve as an example in this disclosure. A method of maximizing the process window, according to an example, is described below.

In a first step, starting from a known condition $(f_0, \varepsilon_0)$ in the process window, wherein $f_0$ is a nominal focus and $\varepsilon_0$ is a nominal dose, minimizing one of the cost functions below in the vicinity $(f_0 \pm \Delta f, \varepsilon_0 \pm \varepsilon)$:

$$CF(z_1, z_2, \ldots, z_N, f_0, \varepsilon_0) = \quad \text{(Eq. 7)}$$
$$\max_{(f,\varepsilon)=(f_0 \pm \Delta f, \varepsilon_0 \pm \varepsilon)} \max_p |f_p(z_1, z_2, \ldots, z_N, f, \varepsilon)| \text{ or}$$

$$CF(z_1, z_2, \ldots, z_N, f_0, \varepsilon_0) = \quad \text{(Eq. 7')}$$
$$\sum_{(f,\varepsilon)=(f_0 \pm \Delta f, \varepsilon_0 \pm \varepsilon)} \sum_p w_p f_p^2(z_1, z_2, \ldots, z_N, f, \varepsilon) \text{ or}$$

$$CF(z_1, z_2, \ldots, z_N, f_0, \varepsilon_0) = \quad \text{(Eq. 7'')}$$
$$(1-\lambda)\sum_{(f,\varepsilon)=(f_0 \pm \Delta f, \varepsilon_0 \pm \varepsilon)} \sum_p w_p f_p^2(z_1, z_2, \ldots, z_N, f, \varepsilon) +$$
$$\lambda \max_{(f,\varepsilon)=(f_0 \pm \Delta f, \varepsilon_0 \pm \varepsilon)} \max_p |f_p(z_1, z_2, \ldots, z_N, f, \varepsilon)|$$

If the nominal focus $f_0$ and nominal dose $\varepsilon_0$ are allowed to shift, they can be optimized jointly with the design variables $(z_1, z_2, \ldots, z_N)$. In the next step, $(f_0 \pm \Delta f, \varepsilon_0 \pm \varepsilon)$ is accepted as part of the process window, if a set of values of $(z_1, z_2, \ldots, z_N, f, \varepsilon)$ can be found such that the cost function is within a preset limit.

If the focus and dose are not allowed to shift, the design variables $(z_1, z_2, \ldots, z_N)$ are optimized with the focus and dose fixed at the nominal focus $f_0$ and nominal dose $\varepsilon_0$. In an alternative example, $(f_0 \pm \Delta f, \varepsilon_0 \pm \varepsilon)$ is accepted as part of the process window, if a set of values of $(z_1, z_2, \ldots, z_N)$ can be found such that the cost function is within a preset limit.

The methods described earlier in this disclosure can be used to minimize the respective cost functions of Eqs. 7, 7', or 7''. If the design variables represent one or more characteristics of the projection optics, such as the Zernike coefficients, then minimizing the cost functions of Eqs. 7, 7', or 7'' leads to process window maximization based on projection optics optimization, i.e., LO. If the design variables represent one or more characteristics of the illumination and patterning device in addition to those of the projection optics, then minimizing the cost function of Eqs. 7, 7', or 7'' leads to process window maximizing based on SMLO, as illustrated in FIG. 11. If the design variables represented one or more characteristics of the source and patterning device, then minimizing the cost functions of Eqs. 7, 7', or 7'' leads to process window maximization based on SMO. The cost functions of Eqs. 7, 7', or 7'' can also include at least one $f_p$ $(z_1, z_2, \ldots, z_N)$ such as described herein, that is a function of one or more stochastic variations such as the LWR, local CD variation of 2D features, and/or throughput.

Figure 14:
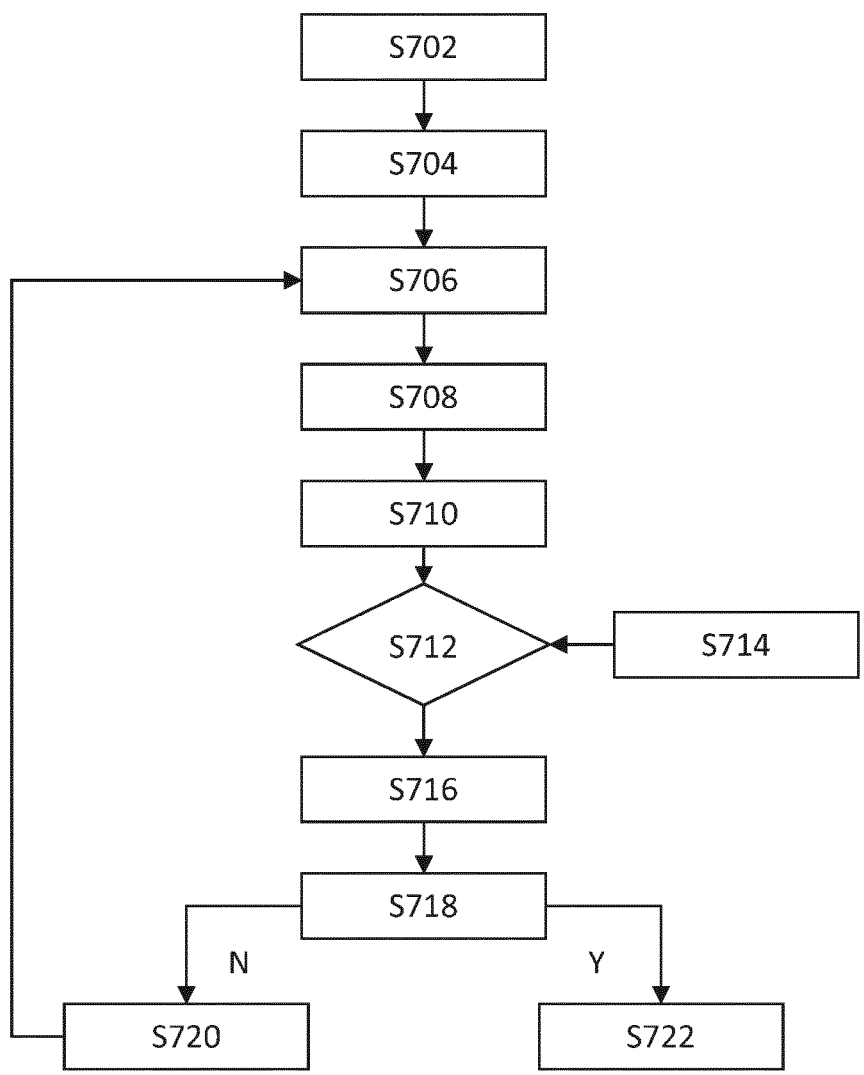

FIG. 14 shows one specific example of how a simultaneous SMLO process can use a Gauss Newton Algorithm for optimization. In step S702, starting values of one or more design variables are identified. A tuning range for each variable may also be identified. In step S704, the cost function is defined using the one or more design variables. In step S706, the cost function is expanded around the starting values for all evaluation points in the design layout. In optional step S710, a full-chip simulation is executed to cover all critical patterns in a full-chip design layout. A desired lithographic response metric (such as CD or EPE) is obtained in step S714, and compared with predicted values of those quantities in step S712. In step S716, a process window is determined. Steps S718, S720, and S722 are similar to corresponding steps S514, S516 and S518, as described with respect to FIG. 13A. As mentioned before, the final output may be, for example, a wavefront aberration map in the pupil plane, optimized to produce the desired imaging performance. The final output may be, for example, an optimized illumination map and/or an optimized design layout.

Figure 13B:
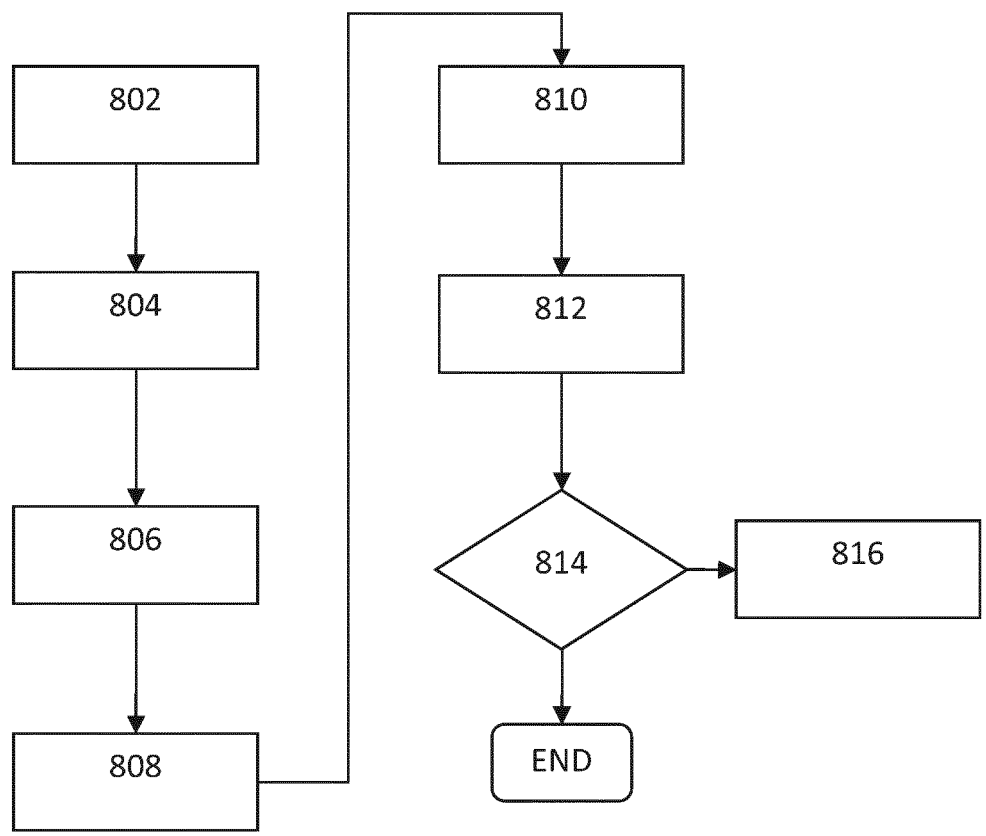

FIG. 13B shows an exemplary method to optimize the cost function where the design variables $(z_1, z_2, \ldots, z_N)$ include design variables that may only assume discrete values.

The method starts by defining the pixel groups of the illumination and the patterning device tiles of the patterning device (step 802). Generally, a pixel group or a patterning device tile may also be referred to as a division of a lithographic process component. In one exemplary approach, the illumination is divided into 117 pixel groups, and 94 patterning device tiles are defined for the patterning device, substantially as described above, resulting in a total of 211 divisions.

In step 804, a lithographic model is selected as the basis for lithographic simulation. A lithographic simulation produces results that are used in calculations of one or more lithographic metrics, or responses. A particular lithographic metric is defined to be the performance metric that is to be optimized (step 806). In step 808, the initial (pre-optimization) conditions for the illumination and the patterning device are set up. Initial conditions include initial states for the pixel groups of the illumination and the patterning device tiles of the patterning device such that references may be made to an initial illumination shape and an initial patterning device pattern. Initial conditions may also include mask bias, NA, and/or focus ramp range. Although steps 802, 804, 806, and 808 are depicted as sequential steps, it will be appreciated that in other examples, these steps may be performed in other sequences.

In step 810, the pixel groups and patterning device tiles are ranked. Pixel groups and patterning device tiles may be interleaved in the ranking. Various ways of ranking may be employed, including: sequentially (e.g., from pixel group 1 to pixel group 117 and from patterning device tile 1 to patterning device tile 94), randomly, according to the physical locations of the pixel groups and patterning device tiles (e.g., ranking pixel groups closer to the center of the illumination higher), and/or according to how an alteration of the pixel group or patterning device tile affects the performance metric.

Once the pixel groups and patterning device tiles are ranked, the illumination and patterning device are adjusted to improve the performance metric (step 812). In step 812, each of the pixel groups and patterning device tiles are analyzed, in order of ranking, to determine whether an alteration of the pixel group or patterning device tile will result in an improved performance metric. If it is determined that the performance metric will be improved, then the pixel group or patterning device tile is accordingly altered, and the resulting improved performance metric and modified illumination shape or modified patterning device pattern form the baseline for comparison for subsequent analyses of lower-ranked pixel groups and patterning device tiles. In other words, alterations that improve the performance metric are retained. As alterations to the states of pixel groups and patterning device tiles are made and retained, the initial illumination shape and initial patterning device pattern changes accordingly, so that a modified illumination shape and a modified patterning device pattern result from the optimization process in step 812.

In other approaches, patterning device polygon shape adjustments and pairwise polling of pixel groups and/or patterning device tiles are also performed within the optimization process of 812.

In an example, the interleaved simultaneous optimization procedure may include altering a pixel group of the illumination and if an improvement of the performance metric is found, the dose or intensity is stepped up and/or down to look for further improvement. In a further example, the stepping up and/or down of the dose or intensity may be replaced by a bias change of the patterning device pattern to look for further improvement in the simultaneous optimization procedure.

In step 814, a determination is made as to whether the performance metric has converged. The performance metric may be considered to have converged, for example, if little or no improvement to the performance metric has been witnessed in the last several iterations of steps 810 and 812. If the performance metric has not converged, then the steps of 810 and 812 are repeated in the next iteration, where the modified illumination shape and modified patterning device from the current iteration are used as the initial illumination shape and initial patterning device for the next iteration (step 816).

The optimization methods described above may be used to increase the throughput of the lithographic projection apparatus. For example, the cost function may include a $f_p(z_1, z_2, \ldots, z_N)$ that is a function of the exposure time. In an example, optimization of such a cost function is constrained or influenced by a measure of the stochastic variation or other metric.

Specifically, a computer-implemented method to increase a throughput of a lithographic process may comprise optimizing a cost function that is a function of one or more stochastic variations of the lithographic process and a function of an exposure time of the substrate, in order to reduce or minimize the exposure time.

In one example, the cost function includes at least one $f_p(z_1, z_2, \ldots, z_N)$ that is a function of one or more stochastic variations. The one or more stochastic variations may include LWR and/or local CD variation of 2D features. In one example, the one or more stochastic variations include one or more stochastic variations of one or more characteristics of an aerial image or a resist image. For example, such a stochastic variation may include line edge roughness (LER), line width roughness (LWR) and/or local critical dimension uniformity (LCDU). Including one or more stochastic variations in the cost function allows finding values of one or more design variables that minimize the one or more stochastic variations, thereby reducing risk of defects due to stochastic variation.

Figure 15A:
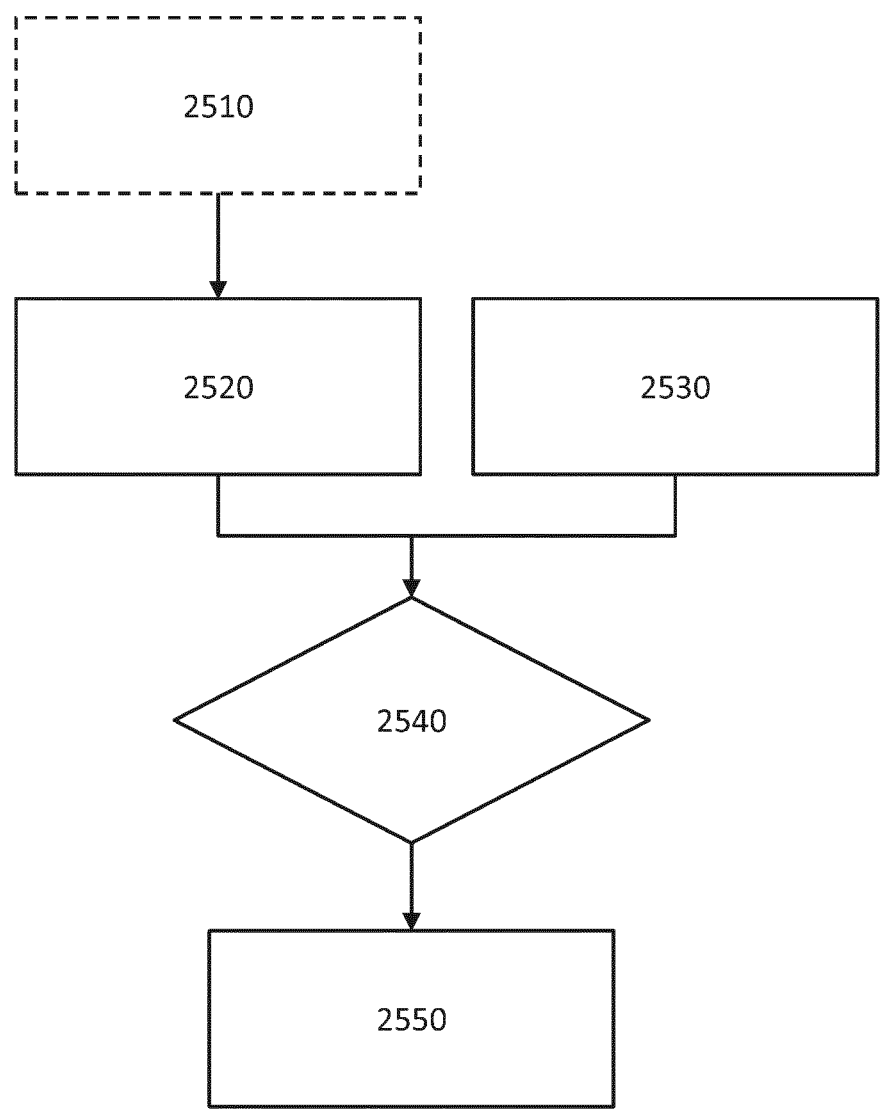
FIG. 15A shows a flow chart for a method of identifying a hot spot on the aerial image or resist image based on a stochastic variation (e.g., LER) of a characteristic or on a function thereof (e.g., bl_ILS, ILS, or NILS).

FIG. 15A shows a flow chart for a method of identifying a hot spot of an aerial image or resist image based on a stochastic variation (e.g., LER) of a characteristic or on a variable (e.g., bl_ILS, ILS, or NILS) that is a function of or affects a stochastic variation, according to an example. In optional step 2510, a value of a variable (e.g., bl_ILS, ILS, or NILS) that is a function of or affects a stochastic variation (e.g., LER) for a characteristic (e.g., edge location) of an aerial image or resist image is obtained. In step 2520, a value of the stochastic variation (e.g., LER) of the characteristic is obtained (e.g., from the value of the variable). In step 2530, a range of the characteristic is obtained. The range may be due to any suitable limitation. For example, when the stochastic variation is LER, the range may be dictated by a geometry of the pattern of the design layout. For example, the maximum of the LER may not exceed the width of a gap from an edge to its neighboring edge. In step 2540, the value of the stochastic variation is compared with the range. If the stochastic variation exceeds the range, the characteristic is identified as a hot spot in step 2550. Further processing, such as optimization to reduce the stochastic variation, may be carried out for that characteristic identified as a hot spot.

Figure 15B:
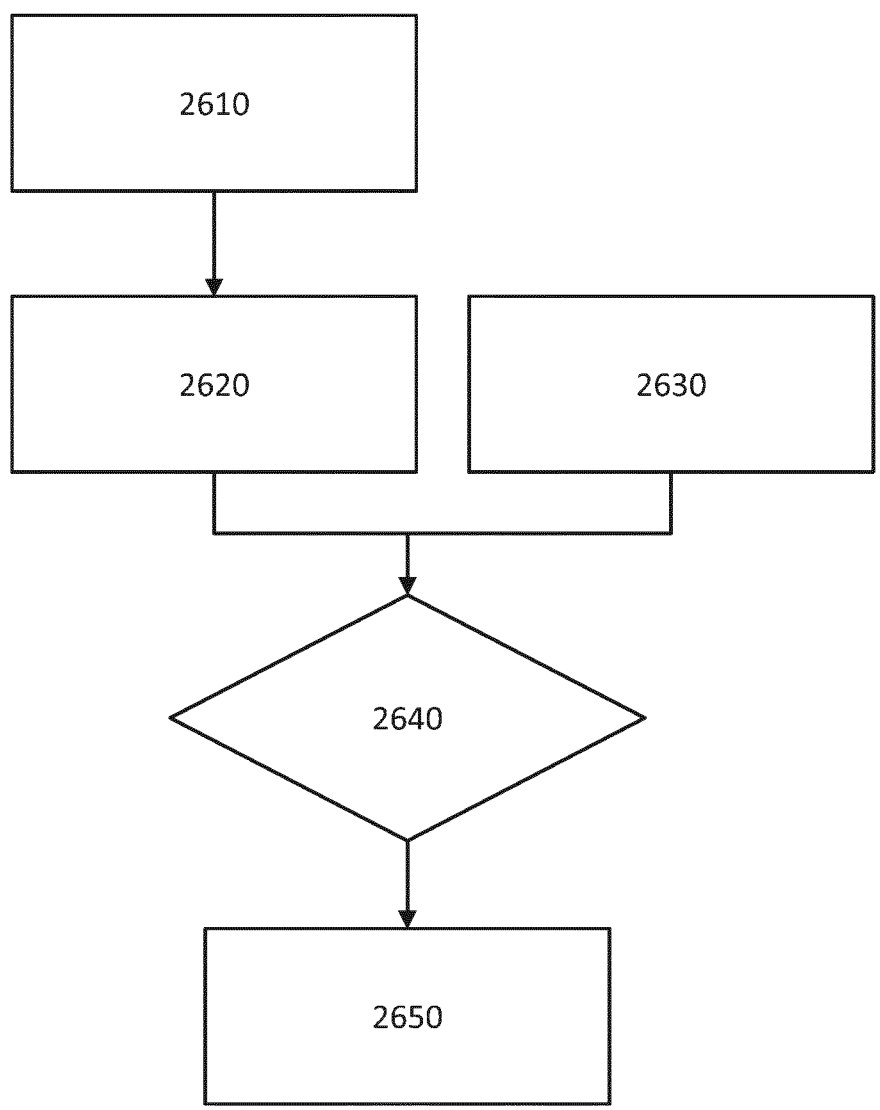
FIG. 15B shows a flow chart for a further method of identifying a hot spot on the aerial image or resist image based on a stochastic variation (e.g., LER) of a characteristic (e.g., edge location) of an aerial image or resist image or on a function thereof (e.g., bl_ILS, ILS, or NILS).

FIG. 15B shows a flow chart for a method of identifying a hot spot of an aerial image or resist image based on a stochastic variation (e.g., LER) of a characteristic (e.g., edge location) of an aerial image or resist image or on a variable (e.g., bl_ILS, ILS, or NILS) that is a function of or affects the stochastic variation, according to an example. In step 2610, a range of the characteristic is obtained. In step 2620, a range of the stochastic variation (e.g., LER) or a range of the variable (e.g., bl_ILS, ILS, or NILS) is obtained based on the range of the characteristic. In step 2630, a value of the stochastic variation or a value of the variable is obtained. In step 2640, the value of the stochastic variation or the value of the variable is compared with the respective range thereof. If the value of the stochastic variation or the value of the variable exceeds the respective range thereof, the characteristic is identified as a hot spot in step 2650. Further processing, such as optimization to reduce the stochastic variation, may be carried out for that characteristic identified as a hot spot.

Figure 16:
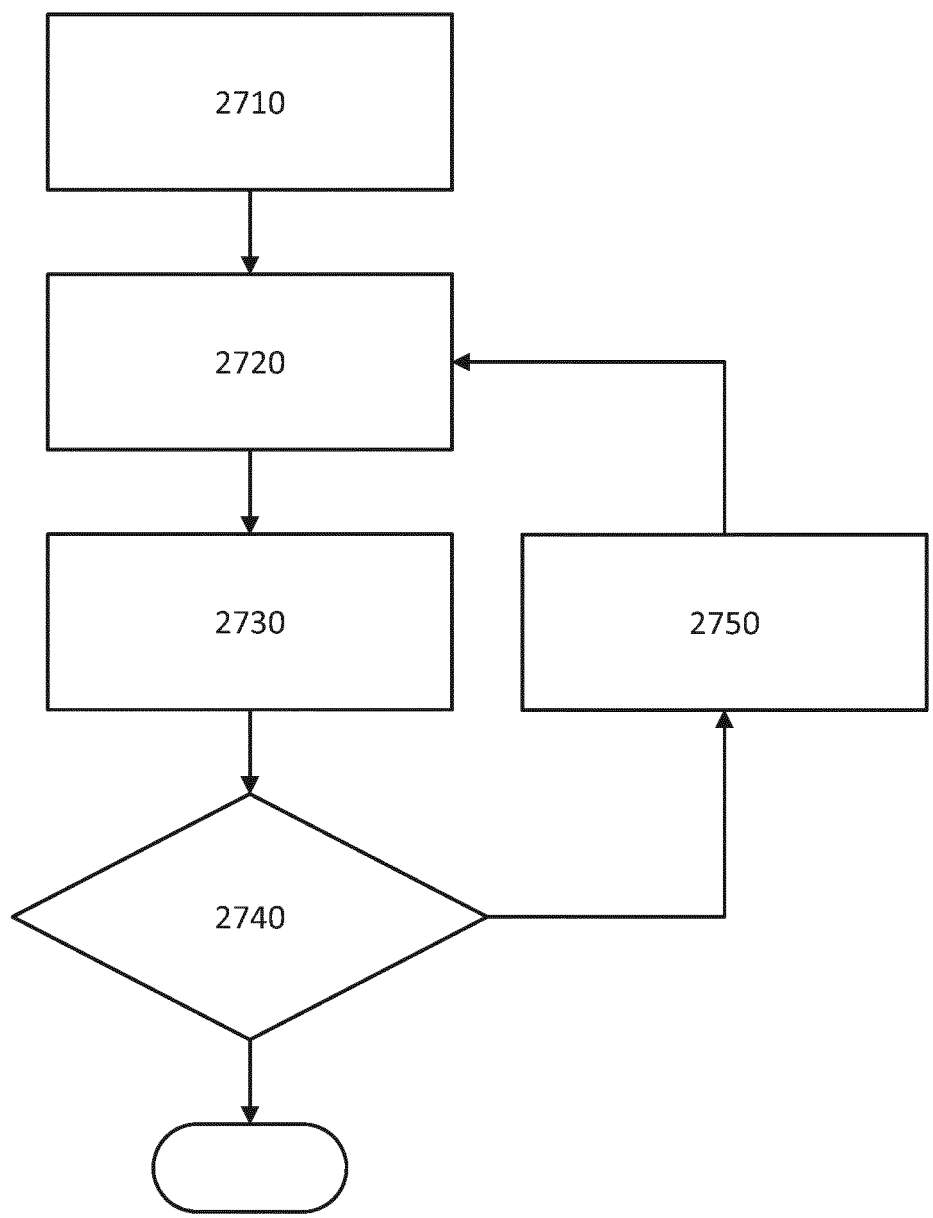
FIG. 16 shows a flow chart for a method of reducing a stochastic variation (e.g., LER) of one or more characteristics (e.g., edge location) of an aerial image or resist image.

FIG. 16 shows a flow chart for a method of reducing a stochastic variation (e.g., LER) of one or more characteristics (e.g., edge location) of an aerial image or resist image, according to an example. In step 2710, obtain the one or more characteristics by identifying them as a hot spot from a portion of a design layout, for example, using the method of FIG. 15A or FIG. 15B. In step 2720, reducing the stochastic variation of the one or more characteristics, for example, by using a cost function that represents at least the stochastic variation or a variable (e.g., bl_ILS, ILS, or NILS) that is a function of or affects the stochastic variation. In step 2730, re-identifying a hot spot from the portion of the design layout. In step 2740, determine if a hot spot is identified. If a hot spot is identified, proceed to step 2750; if none is identified, the method ends. In step 2750, change one or more parameters of the optimization (e.g., δ and/or the user-selected offset) and the method reiterates to step 2720 and perform the optimization with the changed one or more parameter. In an alternative, the one or more parameters may be part of the design layout and steps 2740 and 2750 may be eliminated.

Figure 17:
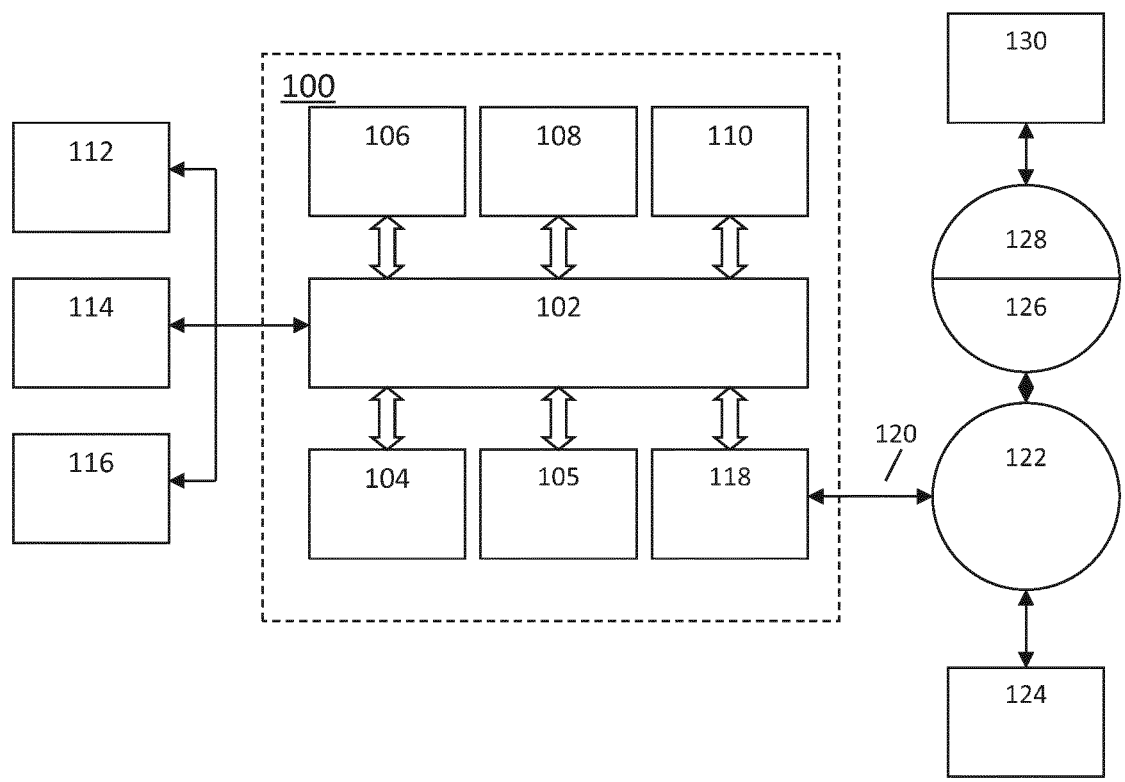
FIG. 17 is a block diagram of an example computer system.

FIG. 17 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one example, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative example, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the example, for example. The received code may be executed by processor 104 as it is received, and/or stored in storage device 110, or other non-volatile storage for later execution. In this manner, computer system 100 may obtain application code in the form of a carrier wave.

Figure 18:
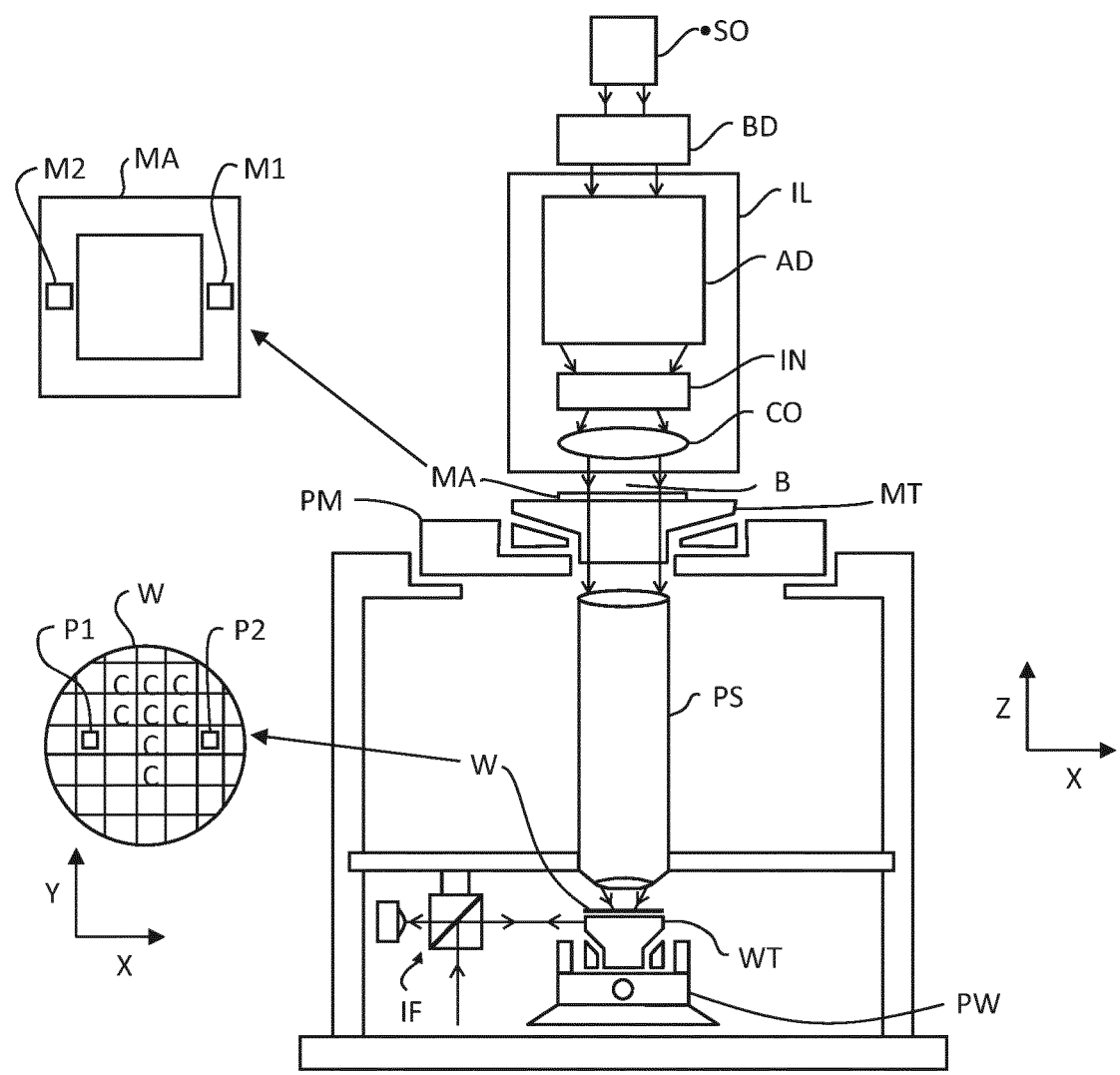
FIG. 18 is a schematic diagram of a lithographic projection apparatus.

FIG. 18 schematically depicts an exemplary lithographic projection apparatus whose illumination could be optimized utilizing the methods described herein. The apparatus comprises:

- an illumination system IL, to condition a beam B of radiation. In this particular case, the illumination system also comprises a radiation source SO;
- a first object table (e.g., patterning device table) MT provided with a patterning device holder to hold a patterning device MA (e.g., a reticle), and connected to a first positioner to accurately position the patterning device with respect to item PS;
- a second object table (substrate table) WT provided with a substrate holder to hold a substrate W (e.g., a resist-coated silicon wafer), and connected to a second positioner to accurately position the substrate with respect to item PS;
- a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 18 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 18. However, in the case of a stepper (as opposed to a step-and-scan tool) the patterning device table MT may just be connected to a short stroke actuator, or may be fixed.

The depicted tool can be used in two different modes:
- In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 19:
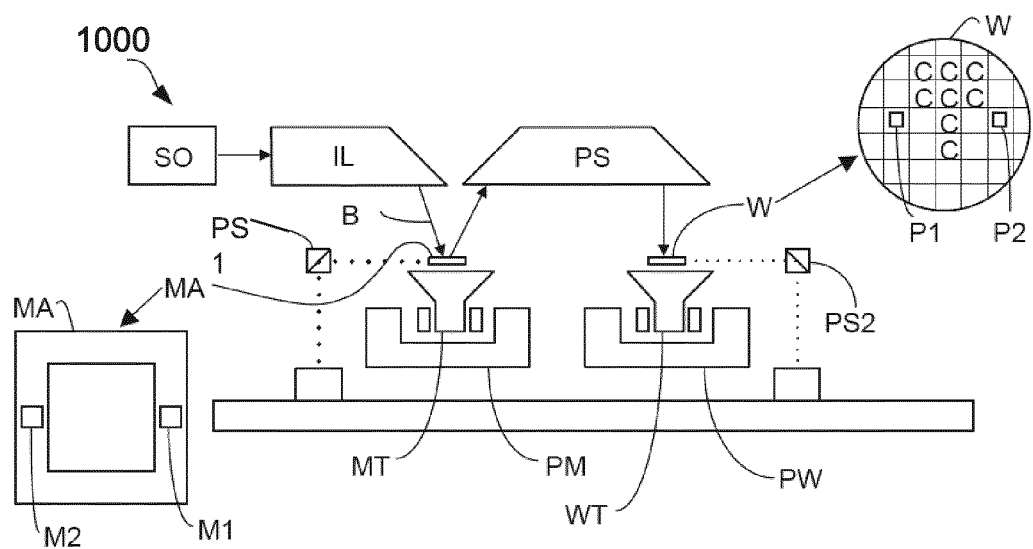
FIG. 19 is a schematic diagram of another lithographic projection apparatus.

FIG. 19 schematically depicts another exemplary lithographic projection apparatus 1000 whose illumination could be optimized utilizing the methods described herein.

The lithographic projection apparatus 1000 comprises:
a source collector module SO
an illumination system (illuminator) IL configured to condition a radiation beam B (e.g. EUV radiation).
a support structure (e.g. a patterning device table) MT constructed to support a patterning device (e.g. a mask or a reticle) MA and connected to a first positioner PM configured to accurately position the patterning device;
a substrate table (e.g. a wafer table) WT constructed to hold a substrate (e.g. a resist coated wafer) W and connected to a second positioner PW configured to accurately position the substrate; and
a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective patterning device). It is to be noted that because most materials are absorptive within the EUV wavelength range, the patterning device may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 19, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 19, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as G-outer and G-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. patterning device table) MT and the substrate table WT are scanned synchronously while a pattern imparted to the radiation beam is projected onto a target portion C (i.e. a single dynamic exposure). The velocity and direction of the substrate table WT relative to the support structure (e.g. patterning device table) MT may be determined by the (de-)magnification and image reversal characteristics of the projection system PS.

3. In another mode, the support structure (e.g. patterning device table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 20:
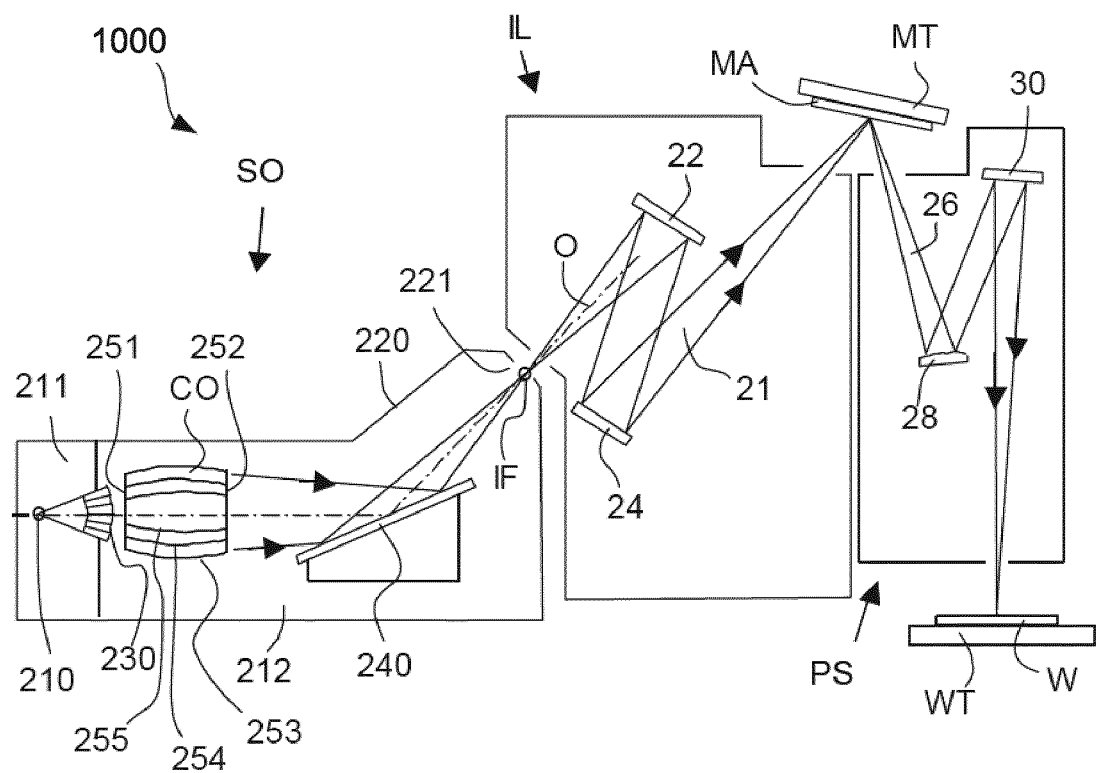
FIG. 20 is a more detailed view of the apparatus in FIG. 19.

FIG. 20 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an example, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 20.

Collector optic CO, as illustrated in FIG. 20, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 21:
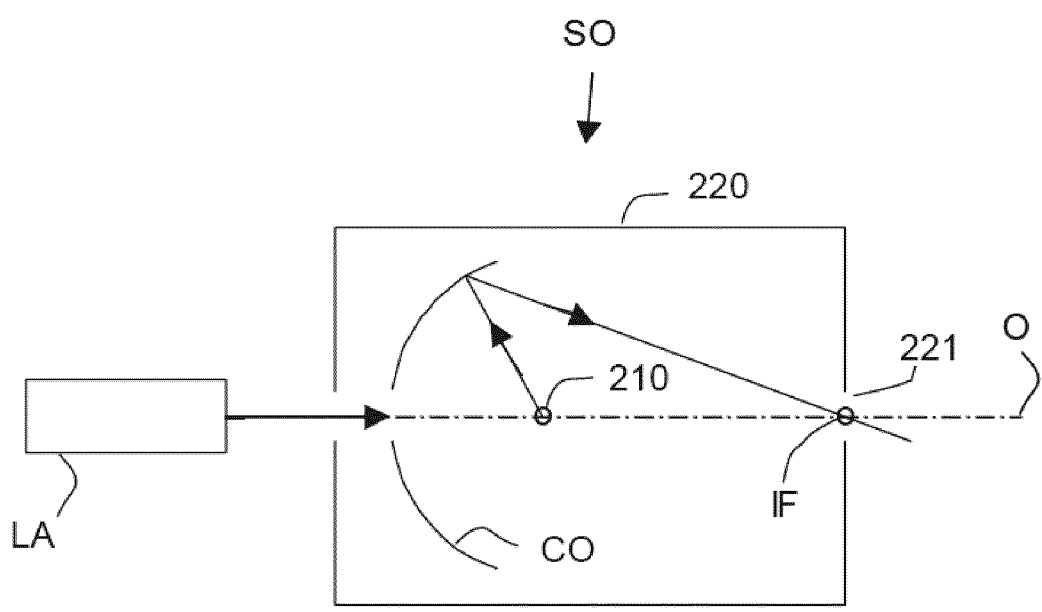
FIG. 21 is a more detailed view of the source collector module SO of the apparatus of FIG. 19 and FIG. 20.

Alternatively, the source collector module SO may be part of an LPP radiation system as shown in FIG. 21. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

U.S. Patent Application Publication No. US 2013-0179847 is hereby incorporated by reference in its entirety.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The above-described techniques have been described for the specific application of improving the specific lithographic process of imaging a portion of a design layout onto a substrate using a lithographic apparatus.

Embodiments generally provide techniques that use image-related metrics to improve any of the manufacture, testing, measurement and other processes of semiconductor structures on a substrate. In particular, a new image-related metric is generated. The new image-related metric is referred to throughout the present document as overlay margin. Overlay margin provides an indication of the tolerance against overlay errors in features that are being manufactured.

Embodiments also provide techniques for improving the determination of control parameters in any of the processes performed during the manufacture, testing, measurement and other processes that may be performed on a semiconductor structure on a substrate in dependence on the overlay margin.

Overlay margin may be determined from a plurality of images of different layers and parts of a substrate. Each image may be obtained by an imaging device, such as an e-beam based metrology apparatus or any type of scanning electron microscope. An e-beam apparatus (for example manufactured by HMI) may have a 10 μm by 10 μm field of view.

The processes that may be improved by the techniques of embodiments include any of: a lithographic process, scanning processes, a priming process, a resist coating process, a soft baking process, a post-exposure baking process, a development process, a hard baking process, measurement/inspection processes, an etching process, an ion-implantation process, a metallization process, an oxidation process and a chemo-mechanical polishing process. The overlay margin may be used to determine control parameters for any of these processes as well as any combination of these processes.

Embodiments may include performing both computational metrology and control processes. The computational processes comprise obtaining one or more images of parts of a substrate on each of a plurality of layers of the substrate. Each obtained image comprises features comprised by a structure that is being manufactured on the substrate. An overlay margin is calculated in dependence on the properties of the features, such as the contours of the features. Control parameters for controlling processes in the manufacturing and other process of the features can then then determined in dependence on the overlay margin.

Figure 24:
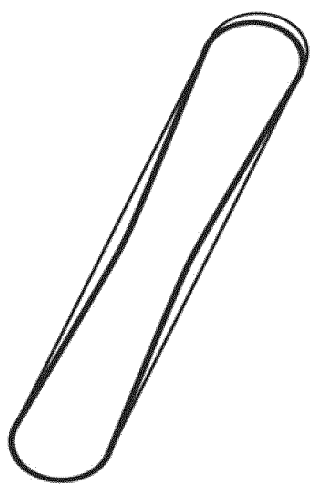
FIG. 24 shows an image of a feature on a substrate.

FIG. 24 shows an image of a feature on part of a substrate. The image may represent, for example, a 10 μm by 10 μm area on the substrate. The thick line in the image is a target contour of one of the features. The thin line in the image is the actual outline of the manufactured feature. Although the ideal shape of the feature may be a rectangle, the target contour is curved/rounded since this is the closest possible shape to a rectangle that can be manufactured and therefore the best contour that can actually be achieved. The ideal shape may alternatively be used as the target shape.

Figure 25:
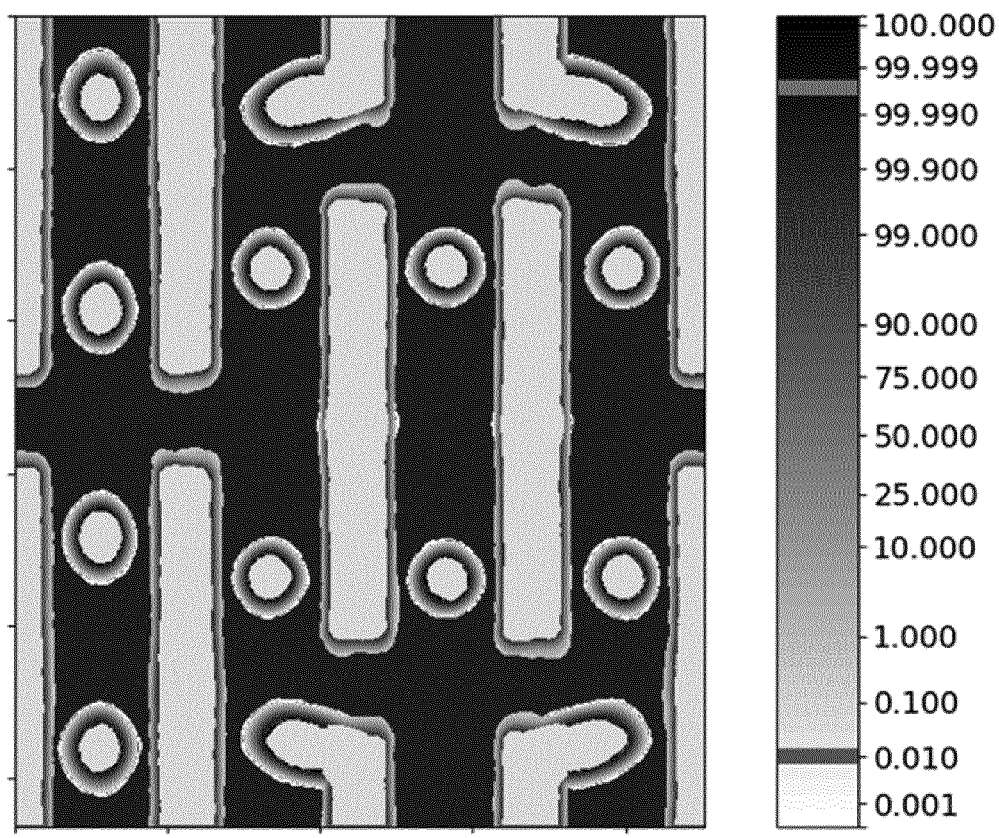
FIG. 25 shows a plurality of aligned and stacked images according to an embodiment.

FIG. 25 shows a plurality of stacked images. The images that have been stacked may have each been obtained from one or more corresponding images of the same feature in different layers of a substrate and/or images of a plurality of features on the same layer of a substrate. The images may additionally, or alternatively, be of features on a plurality of different substrates and/or images of the same feature on the same layer of the substrate but taken by different imaging devices.

When stacking the images, an alignment process has been performed. The alignment process may be based on aligning the images in dependence on one or more reference positions in, or superimposed onto, each of the images so that there is no overlay error between the images. For example, the alignment process may comprise aligning the target designs of the features in the images so that there is no overlay error between the target designs. The alignment process may be based on aligning the images in dependence on gds data. The effect of performing the alignment process is to remove the effects of any overlay error between the different images.

The overlay margin is a measure of the stochastic variation of features in the stack of aligned images. The overlay margin may be calculated in dependence on the differences between the contours of corresponding features in the aligned versions of the images. The overlay margin may also be calculated in dependence on the target contours for the features. For example, for each of the images, the overlay margin may be calculated in dependence on a comparison of the feature in the image with the target of the feature. The differences between the contours of features in an image and the contours of features in other images, as well as target contours for the features, can be determined by a plurality of well-known specific image-related metrics, such as critical dimension uniformity (CDU), line width roughness (LWR), critical dimension amplitude and placement errors.

Overlay margin is related to the known image-metric Edge Placement Error (EPE). EPE is an image-metric that provides an overall representation of the differences between the contours of one or more images of features and a target contours for the features. EPE includes the overlay error between the images of features and the target contours for the features.

Overlay margin differs from EPE in that it does not include the overlay error between images of the feature because the overlay error is removed by the above-described alignment process.

A way of determining overlay margin is shown in Equation 8.

Overlay Margin=EPE−Overlay Error          (Eq. 8)

Accordingly, the overlay margin may be calculated by calculating the EPE and the overlay error. The overlay error may be calculated in dependence on the alignments performed on the images. The overlay margin may then be calculated by subtracting the overlay error from a calculation of the EPE.

It should be noted that the overlay error in Equation 8 may be calculated as a combination of an actual overlay amount and a design specification. This is because a failure condition may occur when it is desired for there to be an overlap between features in different layers of a structure but, even though an overlap occurs, a required area of overlap is not achieved. Similarly, a failure condition may occur when it is desired for there to be a separation of features in different layers of a structure but, even though the features are separated, a required amount of separation is not achieved. The design specification includes the required area of overlap of features and/or the required amount of separation of features. It is therefore appropriate to calculate the overlay error in dependence on a combination of the actual overlay amount and the design specification.

The overlay margin may alternatively be determined in dependence on combination of contributions to the overlay margin in the aligned images. This is shown in Equation 9.

$$OV_{margin} = \frac{HR_{OPC}}{2} + \frac{3\sigma_{PBA}}{2} + \frac{6\sigma_{LWR}}{\sqrt{2}} + \sqrt{\left(\frac{3\sigma_{CDU}}{2}\right)^2} \quad \text{(Eq. 9)}$$

In Equation 9:

$HR_{OPC}$ is dependent on an error caused by optical proximity correction;

$\sigma_{PBA}$ is dependent on an error caused by proximity bias average;

$\sigma_{LWR}$ is dependent on an error caused by line width roughness; and $\sigma_{CDU}$ is dependent on an error caused by critical dimension uniformity.

In Equation 9, the contributions to determined overlay margin are OPC, PBA, LWR and CDU. Embodiments include alternative constructions of equations of determining the overlay margin that include one or more further contributions to the overlay margin and/or do not include one or more of the contributions to the overlay margin included in Equation 9. The overlay margin may be calculated in dependence on all of the contributions to an EPE calculation apart from the overlay error.

Each of the images is typically of only a small part of the substrate. For example, each image may represent a 10 μm by 10 μm area on the substrate. An overlay margin may calculated in dependence on a plurality of images of different layers of the same part of the substrate. This is the local overlay margin for that part of the substrate.

A plurality of local overlay margins may be calculated for each of a plurality of different parts of the substrate with each of the local overlay margins being calculated in dependence on a plurality of images of different layers of the same part of the substrate. The local overlay margins may be obtained either at all locations on the substrate or at only some of locations on the substrate. When the local overlay margins are obtained at only some of locations on the substrate, the locations may be selected so as to provide a fingerprint of the substrate.

Each image may additionally, or alternatively, be considered a comprising a plurality of sections. Local overlay margins may be calculated for each of the sections of an image such that there are a plurality of local overlay margins for each image.

The overlay margin of a substrate may comprise a plurality of local overlay margins with each of the local overlay margins being calculated in dependence on images of a different part of a substrate and/or sections of the images.

An overlapping overlay margin may be may be defined as the minimum overlay margin of features within an image and/or section of an image.

The overlay margin may be represented as an overlay margin map that shows the local variations of the overlay margin across a substrate.

The overlay margin may alternatively be represented as an overlapping overlay margin map that shows the local variations of the overlapping overlay margin across a substrate.

A global overlay margin may be calculated that is an average of the local overlay margins and/or overlapping overlay margins of the substrate.

The overlay margin, and representations of the overlay margin, may be calculated for each of a plurality of values of each parameter that may contribute to the overlay margin. The dependence of the overlay margin on each parameter may be calculated, or inferred, from the overlay margins calculated for the values of the parameter. The dependence of the overlay margin on a plurality of parameters may also be determined.

For example, an overlapping overlay margin map may be generated that shows the variation of the overlapping overlay margin across the surface of a substrate between two or more layers of the substrate. The overlapping overlay margin map may be determined as a function of critical dimension (CD). A multi-dimensional metric is therefore generated that can be used for overlay and CD co-optimization.

The parameters that may contribute to the overlay margin may include focus, dose, illumination pupil shape (e.g. ellipticity), aberrations (e.g. coma, spherical, astigmatism), etch rate, overlay, contrast, critical dimension, chuck temperature, gas flows and RF power distribution. The dependence of the overlay margin on one or more of these parameters may be determined.

The yield of a semiconductor manufacturing process is dependent on the occurrence of manufacturing errors. Manufacturing errors occur when a required area of overlap between features in different layers of a structure does not occur. Manufacturing errors also occur when a minimum required separation of features in different layers of a structure is not achieved. EPE is a measure of the positional variation of features and contours of the features and can be used to determine an expected yield of correctly manufactured structures and/or the probability of the structures being incorrectly manufactured. Due to the relationship between overlay margin and EPE, as shown in Equation 8, overlay margin may be used to determine an allowable amount of overlay error in order to achieve the expected yield of correctly manufactured structures and/or the probability of the structures being incorrectly manufactured.

The overlay error is dependent on a number of controllable parameters. The values, and possible ranges of values, of the parameters that influence the overlay error may be therefore determined in dependence on the overlay margin so that the overlay error is within a range that is expected to achieve an expected yield. The expected yield may be the desired yield according to a manufacturing specification.

Embodiments include determining the parameters for controlling the manufacturing, inspection and/or testing processes of structures on a substrate in dependence on the overlay margin. Parameters that may be controlled in dependence on the overlay margin include: focus, dose, illumination pupil shape (e.g. ellipticity), aberrations (e.g. coma, spherical, astigmatism), etch rate, overlay, contrast, critical dimension, chuck temperature, gas flows and RF power distribution. The processes that are controlled by the parameters may be a lithographic process, a priming process, a resist coating process, a soft baking process, a post-exposure baking process, a development process, a hard baking process, measurement/inspection processes, an etching process, an ion-implantation process, a metallization process, an oxidation process and a chemo-mechanical polishing process.

The permissible level of EPE is dependent on the manufacturing specification. The manufacturing specification may be dependent on one or more of: a desired yield, a maximum probability of the features being incorrectly manufactured, a determined maximum allowable magnitude of an EPE, a determined maximum allowable overlay error; and a desired yield of semiconductor devices.

As described above, the EPE is dependent on the overlay margin and the overlay error. Accordingly, the overlay margin allows the restraints on the overlay error to be determined so that the EPE is at a particular level. The dependence of the overlay error on each parameter may be determined. The values, and ranges of values, for each of the parameters may therefore be determined in dependence on the overlay margin.

Each parameter may be determined in dependence on one or more of an overlay margin map, one or more local overlay margins and a global overlay margin.

The parameters that affect the overlay error may also be co-determined such that the applied value of one of the control parameters is dependent on an applied value of another of the control parameters. The co-determination of at least two of the control parameters may be dependent on the combined effect of the at least two control parameters and/or the interdependence of the at the least two control parameters. By co-determining the control parameters, the combined effects of the control parameters, and/or the interdependence of effects of the control parameters, can be used to advantageously improve the determination of control parameters for improving yield, or optimizing with respect to any other goal.

The restraints on the rate of change and range of control parameters during a process may be determined. For example, during the manufacture of a device, there will be a limit on the extent that the focus may change between two different locations on a substrate due to the rate at which focus can be changed and the movement speed. Embodiments include using the determined restraints of the control parameters to perform an optimization process on the control parameters given the permissible overlay error. For example, given the restraints on the value of a parameter that may be applied, a parameter may be set at a level that results in an increased contribution to the overlay error. This may be made possible, with the total overlay error remaining within an acceptable range, by controlling another parameter to reduce its contribution to the overlay error.

The overlay error may be dependent on at least one of the co-determined control parameters and the dimensions of features manufactured on a semiconductor device may be dependent on at least one other one of the co-determined control parameters.

The co-determined control parameters may include focus, dose, illumination pupil shape, aberrations, etch rate, overlay, contrast, critical dimension, chuck temperature, gas flows and RF power distribution.

As described above, the relationship between the overlay margin and applied parameters may be determined. The applied values, and applicable ranges, of parameters may be determined in dependence on how the parameters affect the overlay margin.

The determination of the applied values and applicable ranges of parameters may be made in dependence on the effect of the parameters on both the overlay margin and the overlay error.

The co-determination of the applied values and applicable ranges of a plurality of parameters may be made in dependence on the effect of the plurality of parameters on both the overlay margin and the overlay error.

For example, one or more parameters may be determined so as to minimize the overlay margin so as to reduce the restraints on the overlay error. This may allow other parameters to be set at values that increase their contribution to the overlay error. In particular, an overlapping overlay margin map may be determined as a function of critical dimension (CD). This may then be used for overlay and CD co-optimization.

FIG. 26 is a flowchart of a process for determining an image-metric of features on a substrate according to an embodiment.

In step 2601, the process begins.

In step 2603, a first image of a plurality of features on a substrate is obtained.

In step 2605, one or more further images are obtained of a corresponding plurality of features on the substrate, wherein at least one of the one or more further images is of a different layer of the substrate than the first image.

In step 2607, aligned versions of the first and one or more further images are generated by performing an alignment process on the first and one or more further images, wherein the alignment process substantially removes the effect of any overlay error between the features in the first image and the corresponding features in each of the one or more further images.

In step 2609, an image-metric is calculated in dependence on a comparison of the features in the aligned version of the first image and the corresponding features in the aligned versions of the one or more further images.

In step 2611, the process ends.

Embodiments include a number of modifications and variations to the known processes.

Any of the techniques described throughout the present document can be used to determine and optimize image-related metrics of embodiments.

Embodiments determine control parameters for controlling processes in the manufacture of a semiconductor device. The processes include any processes, including measurement processes, and can be performed by any known apparatuses. The processes according to embodiments can be controlled by computing system executing instructions for performing the processes that are stored on a non-transitory computer readable medium.

Further embodiments of the inventions are disclosed in the list of numbered clauses below:

1. A method for determining an image-metric of features on a substrate, the method comprising:
    obtaining a first image of a plurality of features on a substrate;
    obtaining one or more further images of a corresponding plurality of features on the substrate, wherein at least one of the one or more further images is of a different layer of the substrate than the first image;
    generating aligned versions of the first and one or more further images by performing an alignment process on the first and one or more further images, wherein the alignment process substantially removes the effect of any overlay error between the features in the first image and the corresponding features in each of the one or more further images; and
    calculating an image-metric in dependence on a comparison of the features in the aligned version of the first image and the corresponding features in the aligned versions of the one or more further images.
2. The method according to clause 1, wherein each of the plurality of features is created in dependence on a target structure of the feature; and the alignment process of the images comprises substantially aligning the images in dependence on the target structures of the features.
3. The method according to clause 1 or 2, wherein the alignment process of the images comprises substantially aligning the images in dependence on one or more reference positions in, or superimposed onto, each of the images.
4. The method according to any preceding clause, wherein each image is of a different layer of the substrate than the other images.
5. The method according to any preceding clause, wherein there are a plurality of further images and at least one of the further images is of the same layer of the substrate as the first image.
6. The method according to any preceding clause, wherein each image is an image of only part of the substrate.
7. The method according to clause 6, the method further comprising:
    obtaining, for each of a plurality of layers of a substrate, a plurality of images of a plurality of different parts of the layer of the substrate; and
    calculating the image-metric in dependence on images of each of the plurality of different parts of the substrate in a plurality of layers of the substrate.
8. The method according to clause 6 or 7, the method comprising calculating a local image-metric in dependence on a plurality of images of the same part of the substrate;
    wherein the image-metric comprises the local image-metric.
9. The method according to clause 8, the method comprising calculating a plurality of local image-metrics;
    wherein each of the local image-metrics is calculated in dependence on images of a different part of the substrate than the other local image-metrics; and
    wherein the image-metric comprises the plurality of local image-metrics.
10. The method according to clause 9, the method comprising calculating a global image-metric in dependence on the plurality of local image-metrics;
    wherein the image-metric comprises the global image-metric.
11. The method according to any preceding clause, wherein each image of part of the substrate is a 10 µm by 10 µm area on the substrate.
12. The method according to any preceding clause, wherein the image-metric is determined in dependence on the contours of the features in the aligned version of the first image and the contours of the corresponding features in the aligned versions of the one or more further images; and/or the image-metric is determined in dependence on, for one or more of the images, a comparison of the feature in the image with the target of the feature.

13. The method according to any preceding clause, wherein the image-metric is determined in dependence on one or more of critical dimension uniformity, line width roughness, critical dimension amplitude and placement errors of the features in the aligned version of the first image and the corresponding features in the aligned versions of the one or more further images.

14. The method according to any preceding clause, further comprising:
calculating the image-metric for each of a plurality of values of one or more parameters; and
determining the dependence of the image-metric on the one or more parameters in dependence on the calculated image-metrics.

15. The method according to clause 14, wherein the one or more parameters include focus, dose, illumination pupil shape, aberrations, etch rate, overlay, contrast, critical dimension, chuck temperature, gas flows and RF power distribution.

16. The method according to any preceding clause, wherein the image-related metric is an overlay margin, an overlapping overlay margin, an overlay margin map or an overlapping overlay margin map.

17. A method in the manufacturing, inspection and/or testing processes of a device on a substrate, the method comprising:
obtaining an image-metric according to the method of any preceding clause; and
determining one or more control parameters of manufacturing, inspection and/or testing processes of a device on a substrate in dependence on the image-metric.

18. The method according to clause 17 when clause 17 is dependent on clause 14, wherein the one or more control parameters are determined in dependence on the dependence of the image-metrics on the one or more control parameters.

19. The method according to clause 17 or 18, the method further comprising controlling an apparatus in dependence on the determined one or more control parameters.

20. The method according to clause 17, 18 or 19, wherein the one or more control parameters are for one or more of: a lithographic process, a priming process, a resist coating process, a soft baking process, a post-exposure baking process, a development process, a hard baking process, measurement/inspection processes, an etching process, an ion-implantation process, a metallization process, an oxidation process and a chemo-mechanical polishing process.

21. The method according to any of clauses 17 to 20, wherein the one or more control parameters include focus, dose, illumination pupil shape, aberrations, etch rate, overlay, contrast, critical dimension, chuck temperature, gas flows and RF power distribution.

22. The method according to any of clauses 17 to 21, the method comprising further determining the one or more control parameters in dependence on a manufacturing specification;
wherein the manufacturing specification is dependent on one or more of:
a maximum probability of the features being incorrectly manufactured;
a determined maximum allowable magnitude of an edge placement error;
a determined maximum allowable overlay error; and
a desired yield of semiconductor devices.

23. The method according to any of clauses 17 to 22, wherein a plurality of control parameters are co-determined.

24. The method according to clause 23, wherein the co-determination of at least two of the control parameters comprises determining an applied value of one of the control parameters in dependence on an applied value of another of the control parameters.

25. The method according to clause 23 or 24, wherein the co-determination of at least two of the control parameters is dependent on:
the combined effect of the at least two control parameters; and/or
the interdependence of the at the least two control parameters.

26. The method according to any of clauses 23 to 25, wherein:
the overlay error is dependent on at least one of the co-determined control parameters; and
the dimensions of features manufactured on a semiconductor device are dependent on at least one other one of the co-determined control parameters.

27. The method according to any of clauses 22 to 26, wherein the co-determined control parameters are focus, dose, illumination pupil shape, aberrations, etch rate, overlay, contrast, critical dimension, chuck temperature, gas flows and RF power distribution.

28. A system configured to perform the method of any of and preceding clause.

29. The system according to clause 27, wherein the system comprises a computing system and an electron beam apparatus, wherein:
the electron beam apparatus is arranged to obtain images of a substrate; and
the computing system is arranged to receive the obtained images of a substrate and perform the method of clauses 1 to 27.

30. The system according to clause 28 or 29, wherein the system comprises a lithographic apparatus and/or a metrology apparatus.

31. A non-transitory computer-readable medium comprising instructions that, when executed, cause the manufacturing process of a device on a substrate to be controlled according to the method of any of clauses 1 to 27.

The system according to embodiments may comprise a computing system and an electron beam apparatus, wherein the electron beam apparatus is arranged to obtain images of one or more substrates. The system may comprise a lithographic apparatus and/or a metrology apparatus.

Other embodiments of the invention will be apparent to those skilled in the art from consideration of the specification and practice of the embodiments disclosed herein. It is intended that the specification and examples be considered as exemplary only, with a true scope and spirit of the invention being indicated by the following g claims. In addition, where this application has listed the steps of a method or procedure in a specific order, it may be possible, or even expedient in certain circumstances, to change the order in which some steps are performed, and it is intended that the particular steps of the method or procedure claims set forth here below not be construed as being order-specific unless such order specificity is expressly stated in the claim.

What is claimed is:

1. A method comprising:
obtaining a first image of a plurality of features on a substrate;
obtaining one or more further images of a corresponding plurality of features on the substrate, wherein at least one of the one or more further images is of a different layer of the substrate than the first image;
generating aligned versions of the first and one or more further images by performing an alignment process on the first and one or more further images, wherein the alignment process removes the effect of an overlay error between the features in the first image and the corresponding features in each of the one or more further images; and
calculating an image-metric in dependence on a comparison of the features in the aligned version of the first image and the corresponding features in the one or more aligned versions of the one or more further images.

2. The method according to claim 1, wherein each of the plurality of features is created in dependence on a respective target structure; and
the alignment process comprises performance of an alignment of the images in dependence on the respective target structures.

3. The method according to claim 1, wherein the alignment process comprises performance of an alignment of the images in dependence on one or more reference positions in, or superimposed onto, each of the images.

4. The method according to claim 1, wherein each image is of a different layer of the substrate than the other images.

5. The method according to claim 1, wherein each image is an image of only part of the substrate, and further comprising:
obtaining, for each of a plurality of layers of a substrate, a plurality of images of a plurality of different parts of the layer of the substrate; and
calculating the image-metric in dependence on images of each of the plurality of different parts of the substrate.

6. The method according to claim 5, further comprising calculating a local image-metric in dependence on a plurality of images of a same part of the substrate, wherein the image-metric comprises the local image-metric.

7. The method according to claim 6, further comprising calculating a plurality of local image-metrics,
wherein each of the local image-metrics is calculated in dependence on images of a different part of the substrate than the one or more other local image-metrics; and
wherein the image-metric comprises the plurality of local image-metrics.

8. The method according to claim 7, further comprising calculating a global image-metric in dependence on the plurality of local image-metrics,
wherein the image-metric comprises the global image-metric.

9. The method according claim 1, wherein each image of part of the substrate covers an area with a dimension of 10 μm by 10 μm on the substrate.

10. The method according to claim 1, wherein the image-metric is determined in dependence on contours of the features in the aligned version of the first image and contours of the corresponding features in the one or more aligned versions of the one or more further images; and/or the image-metric is determined in dependence on, for one or more of the images, a comparison of one or more feature in the image with a target of the one or more features.

11. The method according claim 1, wherein the image-metric is determined in dependence on one or more selected from: critical dimension uniformity, line width roughness, critical dimension amplitude and/or placement error, of the features in the aligned version of the first image and the corresponding features in the one or more aligned versions of the one or more further images.

12. The method according to claim 1, further comprising:
calculating the image-metric for each of a plurality of values of one or more parameters; and
determining the dependence of the image-metric on the one or more parameters in dependence on the calculated image-metrics.

13. The method according to claim 12, wherein the one or more parameters include one or more selected from: focus, dose, illumination pupil shape, optical aberration, etch rate, overlay, contrast, critical dimension, chuck temperature, gas flow and/or RF power distribution.

14. The method according to claim 1, wherein the image-related metric is an overlay margin, an overlapping overlay margin, an overlay margin map or an overlapping overlay margin map.

15. A method in a manufacturing, inspection and/or testing process of a device on a substrate, the method comprising:
obtaining an image-metric according to the method of claim 1; and
determining one or more control parameters of the manufacturing, inspection and/or testing process in dependence on the image-metric.

16. A system comprising:
an electron beam apparatus arranged to obtain images of a substrate; and
a computing system arranged to receive the obtained images of the substrate and perform the method of claim 1.

17. A non-transitory computer-readable medium comprising instructions that, when executed by a computer system, cause the computer system to at least:
obtain a first image of a plurality of features on a substrate;
obtain one or more further images of a corresponding plurality of features on the substrate, wherein at least one of the one or more further images is of a different layer of the substrate than the first image;
generate aligned versions of the first and one or more further images by performance of an alignment process on the first and one or more further images, wherein the alignment process removes the effect of an overlay error between the features in the first image and the corresponding features in each of the one or more further images; and
calculate an image-metric in dependence on a comparison of the features in the aligned version of the first image and the corresponding features in the one or more aligned versions of the one or more further images.

18. The computer program product of claim 17, wherein each of the plurality of features is created in dependence on a respective target structure and the instructions configured to generate the aligned versions are configured to align the images in dependence on the respective target structures.

19. The computer program product according to claim 17, wherein the instructions configured to generate the aligned versions are configured to align the images in dependence on one or more reference positions in, or superimposed onto, each of the images.

20. The computer program product according to claim 17, wherein the image-related metric is an overlay margin, an overlapping overlay margin, an overlay margin map or an overlapping overlay margin map.

* * * * *